(12) United States Patent
Kim et al.

(10) Patent No.: US 10,411,046 B2
(45) Date of Patent: Sep. 10, 2019

(54) THIN FILM TRANSISTOR ARRAY SUBSTRATE AND FABRICATING METHOD THEREOF

(71) Applicant: SAMSUNG DISPLAY CO., LTD., Yongin-si, Gyeonggi-do (KR)

(72) Inventors: Jee Hoon Kim, Yongin-si (KR); Shin Hyuk Yang, Yongin-si (KR); Yong Hoon Won, Yongin-si (KR); Kwang Soo Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 18 days.

(21) Appl. No.: 15/601,338

(22) Filed: May 22, 2017

(65) Prior Publication Data

US 2018/0102383 A1 Apr. 12, 2018

(30) Foreign Application Priority Data

Oct. 7, 2016 (KR) .......................... 10-2016-0129793

(51) Int. Cl.
*H01L 27/12* (2006.01)
*H01L 27/32* (2006.01)

(52) U.S. Cl.
CPC .......... *H01L 27/1251* (2013.01); *H01L 27/12* (2013.01); *H01L 27/1225* (2013.01); *H01L 27/1255* (2013.01); *H01L 27/1259* (2013.01); *H01L 27/3248* (2013.01); *H01L 27/3262* (2013.01); *H01L 27/3265* (2013.01)

(58) Field of Classification Search
None
See application file for complete search history.

(56) References Cited

U.S. PATENT DOCUMENTS

2006/0103290 A1* 5/2006 Suh ..................... H01L 27/3244
313/463
2007/0045721 A1* 3/2007 Forbes ................ H01L 29/7391
257/328

(Continued)

FOREIGN PATENT DOCUMENTS

KR 1020050001936 A 1/2005
KR 100658068 B1 12/2006

(Continued)

*Primary Examiner* — Bo B Jang
(74) *Attorney, Agent, or Firm* — Cantor Colburn LLP

(57) ABSTRACT

A thin film transistor array substrate includes: a base substrate; a first transistor including a first electrode on a surface of the base substrate, a spacer on the first electrode, a second electrode on the spacer, a first active layer contacting the first electrode, the spacer and the second electrode, and a first gate electrode opposite to the first active layer with a first insulating layer interposed therebetween; a storage capacitor including a first storage electrode integrally connected to the first electrode or the second electrode, and a second storage electrode opposite to the first storage electrode with the first insulating layer interposed therebetween, where the second storage electrode is integrally connected to the first gate electrode; and a second transistor electrically connected to the storage capacitor, where the second transistor includes a second active layer extending in a direction intersecting the base substrate.

19 Claims, 21 Drawing Sheets

(56) References Cited

U.S. PATENT DOCUMENTS

| | | | |
|---|---|---|---|
| 2009/0230385 A1* | 9/2009 | Jang | H01L 51/0545 257/40 |
| 2012/0074388 A1* | 3/2012 | Park | H01L 27/3258 257/40 |
| 2013/0161732 A1 | 6/2013 | Hwang et al. | |
| 2017/0025491 A1* | 1/2017 | Li | H01L 27/3248 |

FOREIGN PATENT DOCUMENTS

| | | |
|---|---|---|
| KR | 101243667 B1 | 3/2013 |
| KR | 1020130074954 A | 7/2013 |
| KR | 101484966 B1 | 1/2015 |

\* cited by examiner

THIN FILM TRANSISTOR ARRAY SUBSTRATE AND FABRICATING METHOD THEREOF

This application claims priority to Korean Patent Application No. 10-2016-0129793, filed on Oct. 7, 2016, and all the benefits accruing therefrom under 35 U.S.C. § 119, the content of which in its entirety is herein incorporated by reference.

BACKGROUND

1. Field

Embodiments of the disclosure relate to a thin film transistor array substrate and a fabricating method thereof.

2. Description of the Related Art

A thin film transistor array substrate is widely used as a backplane of a display device. Recently, as the display device tends to have higher resolution, the size of an individual pixel area of the thin film transistor array substrate gradually decreases.

SUMMARY

Embodiments of the invention relate to a thin film transistor array substrate and a fabricating method thereof, which efficiently utilizes a pixel area and provide a relatively uniform characteristic in deformation such as bending.

According to an embodiment of the disclosure, a thin film transistor array substrate includes: a base substrate; a first transistor including a first electrode on a surface of the base substrate, a spacer on the first electrode, a second electrode on the spacer, a first active layer contacting the first electrode, the spacer and the second electrode, and a first gate electrode opposite to the first active layer with a first insulating layer interposed therebetween; a storage capacitor including a first storage electrode integrally connected to the first electrode or the second electrode, and a second storage electrode opposite to the first storage electrode with the first insulating layer interposed therebetween, where the second storage electrode is integrally connected to the first gate electrode; and a second transistor electrically connected to the storage capacitor, where the second transistor includes a second active layer extending in a direction intersecting the base substrate.

In an embodiment, The second transistor may further include a second gate electrode disposed on the one surface of the base substrate, where the second gate electrode may be opposite to the second active layer with the spacer interposed therebetween, a third electrode connected to an end of the second active layer, and a fourth electrode connected to an opposing end of the second active layer.

In an embodiment, a region of the third electrode and a region of the second gate electrode may be disposed in a same layer on the surface of the base substrate and spaced apart from each other.

In an embodiment, the fourth electrode and the second storage electrode may be integrally connected to each other.

In an embodiment, a region of the spacer between the first electrode and the second electrode may be integrally connected to a region of the spacer between the second gate electrode and the second active layer via a region of the spacer between the base substrate and the first storage electrode.

In an embodiment, the region of the spacer between the first electrode and the second electrode may have a first height, and the region of the spacer between the second gate electrode and the second active layer may have a second height lower than the first height.

In an embodiment, an upper surface of the spacer may have a step corresponding to a height of the first electrode.

In an embodiment, an opening may be defined in a region of the spacer corresponding to a region of the storage capacitor.

In an embodiment, the first electrode and the second gate electrode may be defined by a same metal layer.

In an embodiment, the second electrode and the first storage electrode may be defined by a same metal layer.

In an embodiment, the first gate electrode, the second storage electrode, the third electrode and the fourth electrode may be defined by a same metal layer.

In an embodiment, the first active layer and the second active layer may include an oxide semiconductor.

In an embodiment, at least one of the first active layer and the second active layer may include polycrystalline silicon.

In an embodiment, the second transistor may include a third electrode on the surface of the base substrate, a fourth electrode on the third electrode, where a region of the spacer may be interposed between the third electrode and the fourth electrode, the second active layer contacting the third electrode, the spacer and the fourth electrode, and a second gate electrode opposite to the second active layer with the first insulating layer interposed therebetween.

In an embodiment, the first electrode and the third electrode may be defined by a same metal layer.

In an embodiment, the second electrode and the fourth electrode may be defined by a same metal layer.

In an embodiment, the first gate electrode and the second gate electrode may be defined by a same metal layer.

In an embodiment, the first gate electrode may be a dual gate electrode.

In an embodiment, the thin film transistor array substrate may further include: a second insulating layer covering the first transistor, the second transistor and the storage capacitor; and a pixel electrode disposed on the second insulating layer to overlap with at least one of the first transistor, the second transistor and the storage capacitor, where the pixel electrode may be electrically connected to the second electrode.

In an embodiment, the spacer may include at least one of an organic layer and an inorganic layer.

In an embodiment, an individual pixel area is defined on the surface of the base substrate, and the pixel area may include a light emitting area and a pixel circuit area disposed at a circumference of the light emitting area.

In an embodiment, the thin film transistor array substrate may further include a pixel electrode disposed on the surface of the base substrate in the light emitting area, and the pixel electrode may include a same material as one of the first electrode, the second electrode, and the first gate electrode.

In an embodiment, the pixel electrode may be integrally connected to the first electrode or the second electrode.

According to another embodiment of the disclosure, a method of fabricating a thin film transistor array substrate includes: providing a first electrode of a first transistor in one region of a base substrate; providing a spacer on the first electrode to expose one region of the first electrode while covering another region of the first electrode; providing a second electrode of the first transistor on the spacer; providing an active layer of the first transistor on the first electrode and the second electrode to cover the exposed one region of the first electrode and a region of the second electrode via a of a side surface of the spacer; providing a first insulating layer on the active layer to cover the active layer; and providing a gate electrode of the first transistor on the first insulating layer to be opposite to the active layer with the first insulating layer interposed therebetween, where, a pixel electrode is simultaneously provided on the surface of the base substrate with one of the first electrode, the second electrode, and the gate electrode.

In an embodiment, a first storage electrode of a storage capacitor may be integrally provided with the first electrode or the second electrode.

In an embodiment, a second storage electrode of the storage capacitor may be integrally provided with the gate electrode.

In an embodiment, the method may further include providing a pixel defining layer covering the first transistor after the providing the gate electrode, where at least one of the providing the spacer, the providing the first insulating layer and the providing the pixel defining layer may include forming an opening therein to expose a region of the pixel electrode.

BRIEF DESCRIPTION OF THE DRAWINGS

The above and other features of the invention will become more apparent by describing in further detail exemplary embodiments thereof with reference to the accompanying drawings, in which.

DETAILED DESCRIPTION

Figure 1:
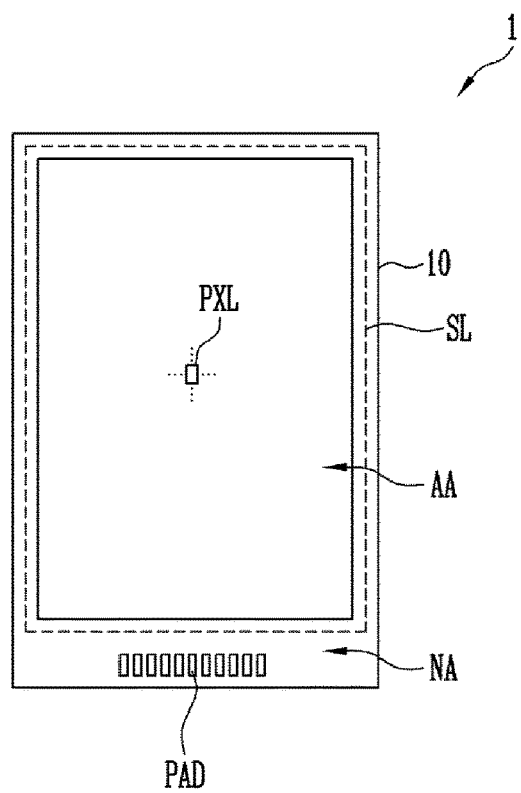
FIG. 1 is a plan view illustrating a display device according to an embodiment of the disclosure.

The invention will be described more fully hereinafter with reference to the accompanying drawings, in which embodiments of the invention are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims set forth herein.

Hereinafter, exemplary embodiments of the invention will be described in detail with reference to the accompanying drawings FIG. 1 is a plan view illustrating a display device according to an embodiment of the disclosure. For convenience, a thin film transistor array substrate among components constituting the display device will be schematically illustrated in FIG. 1.

Referring to FIG. 1, an embodiment of the display device 1 includes a thin film transistor array substrate 10 including an active area AA and a non-active area NA. In some embodiments, the thin film transistor array substrate 10 includes a plurality of pixels PXL disposed in the active area AA, and pixel electrodes and thin film transistors electrically connected to the pixel electrodes may be provided in pixel areas in which the pixels PXL are defined. In such an embodiment, the display device 1 may further include a sealing member (not shown) disposed to overlap with the thin film transistor array substrate 10 in at least the active area AA to seal the active area AA along a sealing line SL, when viewed from a top plan view or a plan view in a thickness direction of the thin film transistor array substrate 10.

In some embodiments, at least one of a base substrate of the thin film transistor array substrate 10 and the sealing member may be a glass substrate or plastic substrate, but the disclosure is not limited thereto. In one embodiment, for example, the base substrate of the thin film transistor array substrate 10 and/or the sealing member may be a flexible substrate including at least one material selected from polyethersulfone, polyacrylate, polyetherimide ("PEI"), polyethylene naphthalate ("PEN"), polyethylene terephthalate ("PET"), polyphenylene sulfide ("PPS"), polyarylate ("PAR"), polyimide ("PI"), polycarbonate ("PC"), cellulose triacetate ("TAC"), and cellulose acetate propionate ("CAP"). In an embodiment, the base substrate and/or the sealing member may be a rigid substrate including at least one material selected from glass and tempered glass. In an embodiment, the base substrate and/or the sealing member may be a substrate including or made of a transparent material, but the disclosure is not limited thereto. In one embodiment, for example, the base substrate and/or the sealing member may be an opaque and/or reflective substrate.

In some embodiments, at least one of the base substrate and the sealing member may be implemented as an insulating layer including at least one of an inorganic layer and/or an organic layer. In one embodiment, for example, the sealing member may be a thin film encapsulation ("TFE") layer including at least one of an inorganic layer and/or an organic layer.

The plurality of pixels PXL may be disposed in the active area AA on the thin film transistor array substrate 10. In some embodiments, each of the pixels PXL may include a light emitting device including a pixel electrode, a counter electrode, and a light emitting layer interposed between the pixel electrode and the counter electrode. In an embodiment, where the display device is a liquid crystal display device using an external light source, each of the pixels PXL may include a pixel electrode, a counter electrode and a liquid crystal layer interposed between the pixel electrode and the counter electrode. In such an embodiment, each of the pixels PXL at least includes a pixel electrode, and the structure of the pixels PXL may be variously modified and embodied according to types of the display device, etc.

In some embodiments, each of the pixels PXL includes a pixel circuit electrically connected to the pixel electrode. The pixel circuit controls light that is generated or transmitted in each of the pixels PXL, corresponding to control signals including a scan signal, a data signal, or the like. Accordingly, the active area AA displays a predetermined image corresponding to the data signal. In such an embodiment, the active area AA may be an effective display area of the display device 1.

The non-active area NA is an area disposed at the periphery of the active area AA, and may be defined by a remaining area except the active area AA. In some embodiments, the pixels PXL are not provided in the non-active area NA. In such an embodiment, the non-active area NA may be a non-effective display area. The non-active area NA may include a line area, a pad area, and/or various dummy areas. In one embodiment, for example, a plurality of pads PAD may be disposed in the non-active area NA disposed at one side of the pixel area AA.

Figure 2A:
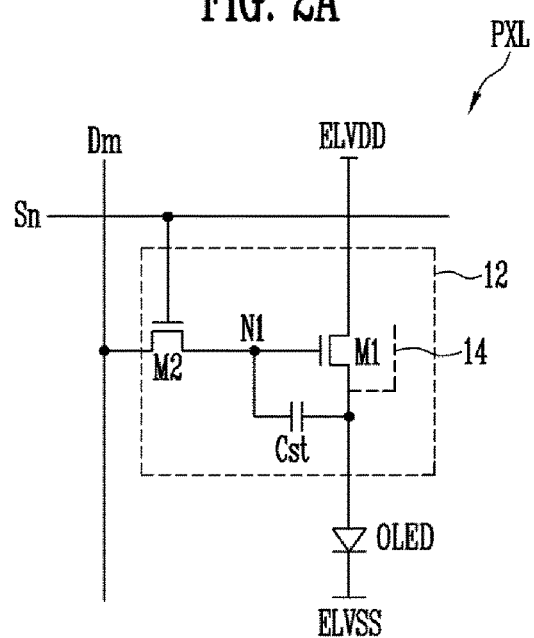
FIGS. 2A to 2C are circuit diagrams illustrating a pixel according to embodiments of the disclosure.
Figure 2B:
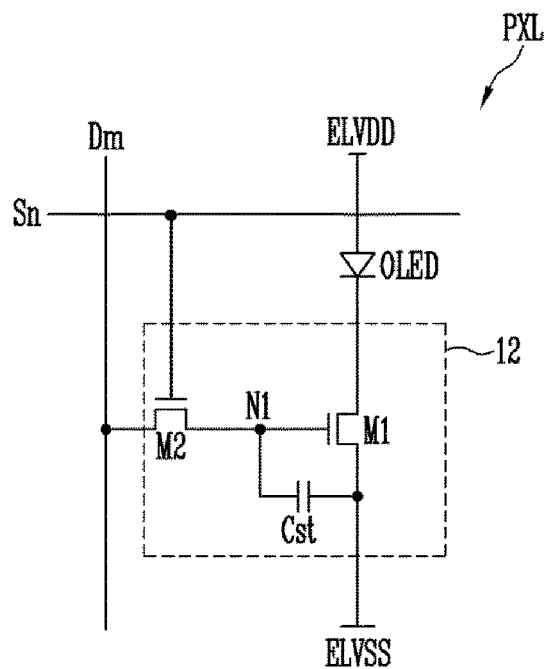
Figure 2C:
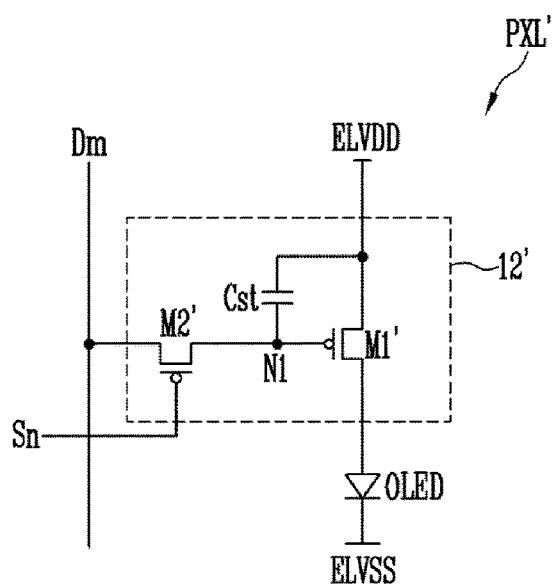

FIGS. 2A to 2C are circuit diagrams illustrating a pixel according to embodiments of the disclosure. For convenience, embodiments of a pixel of an organic light emitting display device, which is connected to an n-th (n is a natural number) scan line and an m-th (m is a natural number) data line and includes two transistors and one capacitor, will be illustrated in FIGS. 2A to 2C. However, the pixel of the disclosure is not limited thereto. In one embodiment, for example, the pixel may further include one or more transistors and/or one or more capacitors. In an alternative embodiment, the pixel may be implemented as a pixel of another type of display device, e.g., a liquid crystal display device.

Referring to FIG. 2A, in an embodiment, the pixel PXL includes a pixel circuit 12 connected to a scan line Sn and a data line Dm, and a light emitting device OLED connected to the pixel circuit 12. In some embodiments, the light emitting device OLED may be an organic light emitting diode, but the disclosure is not limited thereto.

The pixel circuit 12 includes first and second transistors M1 and M2 and a storage capacitor Cst.

In some embodiments, the first transistor M1 includes a drain electrode connected to a first power source ELVDD, a source electrode connected to a pixel electrode (e.g., an anode electrode of the light emitting device OLED), and a gate electrode connected to a first node N1. In some embodiments, the drain and source electrodes of the first transistor M1 may be changed with each other depending on the direction of a voltage applied to the first transistor M1 and/or the type of the first transistor M1. The first transistor M1 controls a driving current flowing in a second power source ELVSS via the light emitting device OLED from the first power source ELVDD, corresponding to a voltage of the first node N1. In such an embodiment, the first transistor M1 may be a driving transistor that controls a driving current of the pixel PXL. In some embodiments, the first power source ELVDD and the second power source ELVSS may be a high potential pixel power source and a low potential pixel power source, respectively.

In some embodiments, the first transistor M1 may further include a bottom metal layer 14 opposite to the gate electrode with an active layer interposed therebetween. In such an embodiment, where the bottom metal layer 14 is provided as described above, output characteristics of the first transistor M1 may be further stabilized.

In some embodiments, the second transistor M2 includes a drain electrode connected to the data line Dm, a source electrode connected to the first node N1, and a gate electrode connected to the scan line Sn. In some embodiments, the drain and source electrodes of the second transistor M2 may be changed with each other depending on the direction of a voltage applied to the second transistor M2 and/or the type of the second transistor M2. The second transistor M2 is turned on when a scan signal having a gate-on voltage (e.g., a high voltage) is supplied from the scan line Sn. When the second transistor M2 is turned on, the data line Dm and the first node N1 are electrically connected to each other. In such an embodiment, the second transistor M2 may be a switching transistor that controls a connection between the pixel PXL and the data line Dm.

In some embodiments, the storage capacitor Cst is connected between one electrode, e.g., the source electrode of the first transistor M1 and the first node N1. The storage capacitor Cst stores a voltage corresponding to a data signal supplied to the first node N1 and maintains the stored voltage for a predetermined period of time. In one embodiment, for example, the storage capacitor Cst may maintain the stored voltage until a data signal of a next frame is supplied. In some embodiments, the connection position of the storage capacitor Cst may be changed. In one embodiment, for example, the storage capacitor Cst may be connected between the first power source ELVDD and the first node N1.

In some embodiments, the light emitting device OLED is connected between the first transistor M1 and the second power source ELVSS. In one embodiment, for example, the light emitting device OLED may include the anode electrode connected to the source electrode of the first transistor M1 and a cathode electrode connected to the second power source ELVSS. The light emitting device OLED emits light with a luminance corresponding to the driving current controlled by the first transistor M1. In such an embodiment, when a data signal corresponding to a black gray level is input to the first node N1, the first transistor interrupts the driving current from flowing in the light emitting device OLED such that the light emitting device OLED does not emit light, and the pixel PXL thereby expresses the black gray level.

In some embodiments, the connection position of the light emitting device OLED may be changed. In one alternative embodiment, for example, the light emitting device OLED, as shown in FIG. 2B, may be connected between the first power source ELVDD and the first transistor M1. In such an embodiment, the anode electrode of the light emitting device OLED may be connected to the first power source ELVDD, and the cathode electrode of the light emitting device OLED may be connected to one electrode, e.g., the drain electrode of the first transistor M1.

Embodiments in which the first and second transistors M1 and M2 are N-type transistors are shown in FIGS. 2A and 2B, but the disclosure is not limited thereto. In some embodiments, at least one of the first and second transistors M1 and M2 may be implemented as a P-type transistor. In one embodiment, for example, the first and second transistors M1 and M2, as shown in FIG. 2C, may be implemented as P-type transistors.

Referring to FIG. 2C, in another alternative embodiment, a pixel PXL' includes a pixel circuit 12' including first and second transistors M1' and M2' and the storage capacitor Cst, and the light emitting device OLED connected to the pixel circuit 12'.

In some embodiments, the first transistor M1' includes a source electrode connected to the first power source ELVDD, a drain electrode connected to the anode electrode of the light emitting device OLED, and a gate electrode connected to the first node N1. In some embodiments, the second transistor M2' includes a source electrode connected to the data line Dm, a drain electrode connected to the first node N1, and a gate electrode connected to the scan line Sn. In some embodiments, the storage capacitor Cst is connected between the first power source ELVDD and the first node N1. An operation of the pixel PXL' shown in FIG. 2C is substantially similar to that of the pixel PXL shown in FIGS. 2A and 2B, and any repetitive detailed description will be omitted.

In such an embodiment, as described above, each pixel PXL or PXL' includes the pixel circuit 12 or 12' connected to the pixel electrode, e.g., the anode electrode of the light emitting device OLED to control driving of the pixel PXL or PXL'. Therefore, an area in which the pixel circuit 12 or 12' is disposed is to be secured in each pixel area. An active display device including the pixel circuit 12 or 12' is operable with a small amount of power, and may effectively control the driving of each pixel PXL or PXL'.

In some embodiments, the pixel circuit 12 or 12' may be disposed in a way such that at least one area thereof overlaps with the light emitting device OLED, or may be disposed in the vicinity of the light emitting device OLED not to overlap with the light emitting device OLED, when viewed from a top plan view. In one embodiment, for example, the pixel circuit 12 or 12' in a top emission display device may be disposed at a lower portion of the light emitting device OLED, and the pixel circuit 12 or 12' in a double sided display device may be disposed in the vicinity of the light emitting device OLED not to overlap with the light emitting device OLED, when viewed from a top plan view.

As the display device tends to have high resolution, the size of an individual pixel area gradually decreases. However, there may be a limitation in decreasing the size of the first and second transistors M1 and M2 and/or the storage capacitor Cst to secure characteristic conditions of the display device. In addition, one or more transistors and/or one or more capacitors are further included in the pixel circuit 12 or 12', a space occupied by the pixel circuit 12 or 12' may further increase. Accordingly, various embodiments related to a pixel structure that efficiently utilizes a limited pixel area will hereinafter be described in detail.

Figure 3:
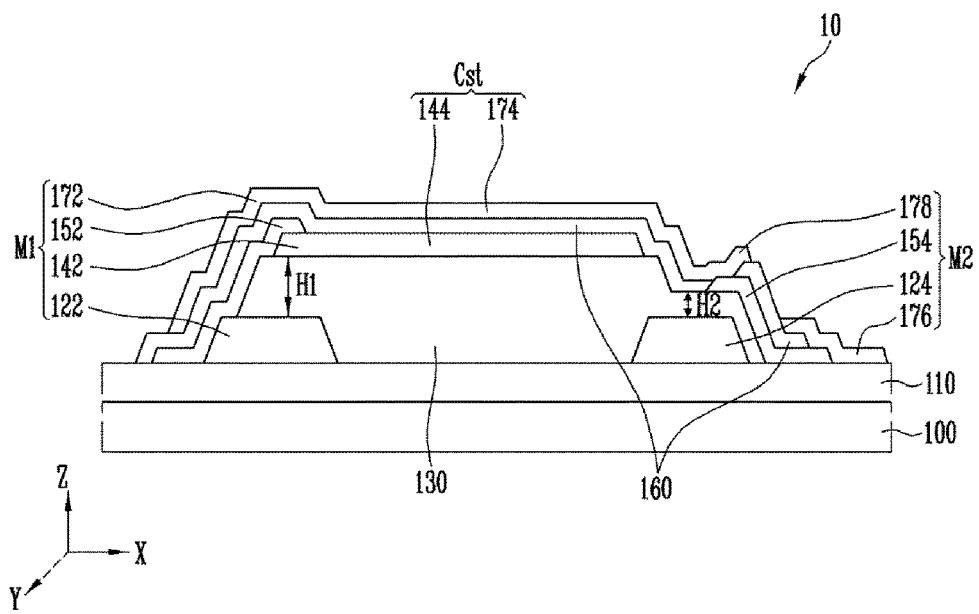
FIG. 3 is a sectional view illustrating an area of a thin film transistor array substrate according to an embodiment of the disclosure.

FIG. 3 is a sectional view illustrating one area of a thin film transistor array substrate according to an embodiment of the disclosure. Particularly, FIG. 3 illustrates the structure of an embodiment of a pixel circuit part located in an individual pixel area. An embodiment to which an integrated organic spacer is applied is illustrated in FIG. 3.

Referring to FIG. 3, an embodiment of the thin film transistor array substrate 10 may include a base substrate 100, and first and second transistors M1 and M2 and a storage capacitor Cst, which are disposed on a surface, e.g., an upper surface, of the base substrate 100. In some embodiments, the first and second transistors M1 and M2 and the storage capacitor Cst may be disposed in each pixel area defined in an active area AA of the base substrate 100.

The base substrate 100, as described above, may be a glass substrate or plastic substrate, but the disclosure is not limited thereto. In an alternative embodiment, the base substrate 100 may be a rigid substrate or flexible substrate.

In an embodiment, the base substrate 100 may be a transparent substrate, but the disclosure is not limited thereto. In one embodiment, for example, the base substrate 100 may be implemented as an opaque or translucent substrate.

In some embodiments, a buffer layer 110 may be disposed on the surface of the base substrate 100. The buffer layer 110 defines a smooth or flat surface on the base substrate 100, and effectively prevents an impurity element from penetrating into the base substrate 100. The buffer layer 110 may include an oxide layer or nitride layer such as SiOx or SiNx, but the disclosure is not limited thereto. In some alternative embodiments, the buffer layer 110 may be omitted.

The first transistor M1, the second transistor M2 and the storage capacitor Cst are disposed on the surface of the base substrate 100 on which the buffer layer 110 is disposed. In some embodiments, at least two of the first transistor M1, the second transistor M2 and the storage capacitor Cst may be disposed to overlap with each other in at least one region, when viewed from a top plan view, or at least a portion of the at least two of the first transistor M1, the second transistor M2 and the storage capacitor Cst may be defined by a single and integrated electrode.

The first transistor M1 includes a first electrode 122, a spacer 130, a second electrode 142, a first active layer 152 and a first gate electrode 172, which are disposed in a region of the base substrate 100. In some embodiments, the first electrode 122, the spacer 130, and the second electrode 142 may be sequentially stacked one on another on the surface of the base substrate 100, and the first active layer 152 may be connected between the first electrode 122 and the second electrode 142. In such an embodiment, the first gate electrode 172 may be disposed to be opposite to the first active layer 152 with a first insulating layer 160 interposed therebetween. In such an embodiment, the first transistor M1 may be implemented as a vertical thin film transistor ("vertical TFT").

In some embodiments, the first electrode 122 may be a drain electrode, but the disclosure is not limited thereto. In one embodiment, for example, the first electrode 122 may be a source electrode depending on the type of the first transistor M1 and/or the direction of a voltage applied to the first transistor M1. The first electrode 122 may be connected to the first power source ELVDD through a first power source line (not shown).

One region of the spacer 130 is interposed between the first electrode 122 and the second electrode 142. In some embodiments, the spacer 130 may be integrally connected from a first region (a first transistor M1 region) between the first electrode 122 and the second electrode 142 to a second region (a second transistor M2 region) between a second gate electrode 124 and a second active layer 154 via a region (a storage capacitor Cst region) between the base substrate 100 and a first storage electrode 144. In such embodiments, the portion of the spacer 130 between the first electrode 122 and the second electrode 142, and the portion of the spacer 130 between the second gate electrode 124 and the second active layer 154 are integrally connected with each other via the portion of the spacer 130 between the base substrate 100 and the first storage electrode 144. Herein, two or more elements may be "integrally connected" when the two or more elements are defined by an element integrally formed as a single unitary unit. The spacer 130 may include at least one of an organic layer and an inorganic layer. In one embodiment, for example, the spacer 130 may include one or more organic insulating layers. The organic material constituting the spacer 130 may be an organic material including polyimide, polyester, acrylic resin, benzocyclobutene, phenol resin or the like, or a stack structure thereof. In an embodiment, the spacer 130 may include an organic insulating material well-known in the art.

In some embodiments, the spacer 130 may have a first height H1 (or a first thickness) in a first region in which the first electrode 122 and the second electrode 142 overlaps with each other, to allow the first and second electrodes 122 and 142 to be spaced apart from each other at a predetermined distance. In some embodiments, the first height H1 may be within a range determined to secure a channel length for the driving transistor.

In some embodiments, the second electrode 142 is disposed on the first electrode 122 such that at least a region of the second electrode 142 overlaps with the first electrode 122, and may be spaced apart from the first electrode 122 at a predetermined distance by the spacer 130. In one embodiment, for example, when the base substrate 100 is disposed on an XY plane, the second electrode 142 may be spaced apart from the first electrode 122 at a distance corresponding to the first height H1 along a Z direction. Herein, the Z direction may be a thickness direction of the base substrate 100. In some embodiments, the second electrode 142 may be a drain electrode depending on the type of the first transistor M1 and/or the direction of a voltage applied to the first transistor M1. The second electrode 142 may be electrically connected to the first storage electrode 144. In one embodiment, for example, the second electrode 142 may be integrally connected to the first storage electrode.

In some embodiments, the first active layer 152 may extend in a direction intersecting the base substrate 100 via a plurality of layers, in which the first electrode 122, the spacer 130 and the second electrode 142 are respectively disposed. In one embodiment, for example, the first active layer 152 may be connected between the first electrode 122 and the second electrode 142 via a region of the side surface of the spacer 130, e.g., an inclined surface (taper region) between the first electrode 122 and the second electrode 142. In one embodiment, for example, the first active layer 152 may be disposed to contact a region of the first electrode 122, the spacer 130 and the second electrode 142 (e.g., one region of one side surface, one section, an upper surface and/or a lower surface thereof). In such an embodiment, the first active layer 152 may be disposed to contact a side surface of each of the first electrode 122, the spacer 130 and the second electrode 142. In such an embodiment, a channel is formed in the first active layer 152 between the first electrode 122 and the second electrode 142 when a gate-on voltage is applied to the first gate electrode 172.

In such an embodiment, the first active layer 152 may be disposed on a line extending in a direction intersecting the base substrate 100 to constitute a vertical channel. In one embodiment, for example, when the XY plane is defined as a plane in which the surface of the base substrate 100 is disposed, the first active layer 152 may extend in a direction vertically or obliquely intersecting the XY plane such that the main surface or length direction of the first active layer 152 is disposed vertically or obliquely to the XY plane. In an embodiment of the disclosure, the vertical channel may comprehensively mean a channel disposed on a line extending in a direction in which the main surface or length direction (or extending direction) of the vertical channel is orthogonal to a plane on which the base substrate 100 is disposed or in a direction obliquely intersecting the plane. In such an embodiment, where the vertical channel is formed as described above, an area occupied by the first transistor M1 in the pixel area may be reduced, and a sufficient channel length desired to ensure characteristics of the first transistor M1 may be secured.

In some embodiments, the first insulating layer 160 is interposed at least between the first active layer 152 and the first gate electrode 172. In such an embodiment, the first insulating layer 160 may be integrally formed at least in the pixel area to be interposed between the first storage electrode 144 and a second storage electrode 174 and between a third electrode 176 and a fourth electrode 178. In one embodiment, for example, the first insulating layer 160 may be integrally formed over the entire active area AA. An opening may be defined in the first insulating layer 160 at a region through which two conductive layers are electrically connected to each other.

In some embodiments, the first insulating layer 160 may include an inorganic layer and/or an organic layer. In one embodiment, for example, the first insulating layer 160 may defined by an inorganic layer including SiOx or SiNx, but the disclosure is not limited thereto. In one embodiment, for example, the first insulating layer 160 may include an inorganic insulating material or organic insulating material including SiOx, SiNx, SiON, SiOF, AlOx or the like, and may have a single layer structure or a multi-layer structure including at least one of materials listed above.

In some embodiments, the first gate electrode 172 is opposite to the first active layer 152 with the insulating layer 160 interposed therebetween. The first gate electrode 172 may be connected to the second storage electrode 174. In one embodiment, for example, the first gate electrode 172 may be integrally connected to the second storage electrode 174.

The storage capacitor Cst includes the first storage electrode 144 and the second storage electrode 174, which are opposite to each other with the first insulating layer 160 interposed therebetween. In some embodiments, the storage capacitor Cst may be disposed on the spacer 130, but the disclosure is not limited thereto.

In some embodiments, the first storage electrode 144 may be electrically connected to the second electrode 142. In such embodiments, the second storage electrode 174 may be electrically connected to the first gate electrode 172.

The second transistor M2 is electrically connected to the storage capacitor Cst. In one embodiment, for example, the second transistor M2 may be electrically connected to the second storage electrode 174 through the fourth electrode 178.

The second transistor M2 includes the second gate electrode 124, the spacer 130, the second active layer 154, the third electrode 176 and the fourth electrode 178, which are disposed in a region of the base substrate 100. In some embodiments, the second gate electrode 124 and the second active layer 154 may be disposed to be opposite to each other with a second region of the spacer 130. In such embodiments, the second active layer 154 may extend in a direction intersecting the base substrate 100. In one embodiment, for example, when the XY plane is defined as a plane in which the surface of the base substrate 100 is disposed, the second active layer 154 may extend in a direction vertically or obliquely intersecting the XY plane such that the main surface or length direction of the second active layer 154 is disposed vertically or obliquely to the XY plane. In such embodiments, the second transistor M2 may be implemented as a vertical thin film transistor.

In some embodiments, the second gate electrode 124 may be disposed in a same layer or directly on a same layer as the first electrode 122 on the base substrate 100, but the disclosure is not limited thereto. The second gate electrode 124 may be electrically connected to the scan line Sn shown in FIGS. 2A to 2C.

In some embodiments, the second region of the spacer 130 is disposed at least between the second gate electrode 124 and the second active layer 154. In some embodiments, a single spacer may function as the spacer 130 for securing a channel length of the first transistor M1, and simultaneously, may function as a gate insulating layer of the second transistor M2.

The spacer 130 may have a predetermined second height H2 (or a second thickness) in at least one region, e.g., the second region in which the second gate electrode 124 and the second active layer 154 overlap with each other, when viewed from a top plan view. The second height H2 may be set within a range determined to ensure response characteristics of the second transistor M2. In one embodiment, for example, the second height H2 may be set within a range where insulating properties between the second gate 124 and the second active layer 154 may be stably ensured, and the second active layer 154 may be smoothly conducted when a scan signal having a gate-on voltage within a predetermined range is applied to the second gate electrode 124. In one embodiment, for example, the second height H2 may be lower than the first height H1.

In some embodiments, the second active layer 154 may be connected between the third and fourth electrodes 176 and 178 via one region of the side surface of the spacer 130. In one embodiment, for example, the second active layer 154 may be disposed to contact one region of each of the third electrode 176, the spacer 130, and the fourth electrode 178 (e.g., at least one region of one side surface, one section, an upper surface and/or a lower surface thereof). A channel is formed in the second active layer 154 between the third electrode 176 and the fourth electrode 178 when a predetermined gate-on voltage is applied to the second gate electrode 124. In such an embodiment, since the third electrode 176 and the fourth electrode 178 are disposed in different layers on the base substrate 100, the second active layer 154 may extend in a direction intersecting the base substrate 100 between the third electrode 176 and the fourth electrode 178 to constitute a vertical channel.

In some embodiments, the third electrode 176 is connected to one end of the second active layer 154. In one embodiment, for example, the third electrode 176 may be electrically connected to the second active layer 154 by directly contacting the one end of the second active layer 154. The third electrode 176 may be electrically connected to the data line Dm shown in FIGS. 2A to 2C. In some embodiments, at least one region of the third electrode 176 may be disposed in the same layer as the second gate electrode 124. In one embodiment, for example, at least one region of the third electrode 176 and the second gate electrode 124 may be disposed to be spaced apart from each other in the same layer on the one surface of the base substrate 100.

In some embodiments, the fourth electrode 178 is connected to the other end of the second active layer 154. In one embodiment, for example, the fourth electrode 178 may be electrically connected to the second active layer 154 by contacting the other end of the second active layer 154 through a contact hole formed in the first insulating layer 160. The fourth electrode 178 may be electrically connected to the second storage electrode 174. In one embodiment, for example, the fourth electrode 178 may be integrally connected to the second storage electrode 174.

In some embodiments, each of the electrodes constituting the first transistor M1, the second transistor M2, and/or the storage capacitor Cst may include at least one of metals, alloys thereof, conductive polymers, and conductive metal oxides. In one embodiment, for example, at least one of the first to fourth electrodes 122, 142, 176, and 178, the first and second gate electrodes 172 and 124, and first and second storage electrodes 144 and 174 may include at least one of metals, alloys thereof, conductive polymers, and conductive metal oxides.

In one embodiment, for example, at least one electrode of the first transistor M1, the second transistor M2, and/or the storage capacitor Cst may include Ti, Cu, Mo, Al, Au, Cr, TiN, Ag, Pt, Pd, Ni, Sn, Co, Rh, Ir, Fe, Ru, Os, Mn, W, Nb, Ta, Bi, Sb, Pb, or the like, and may further include various metals as well as the above-described metals. In one embodiment, for example, at least one electrode of the first transistor M1, the second transistor M2, and/or the storage capacitor Cst may include an alloy such as MoTi, AlNiLa or the like, and may include various alloys as well as the above-described alloys. In one embodiment, for example, at least one electrode of the first transistor M1, the second transistor M2, and/or the storage capacitor Cst may have a multi-layer structure including Ti/Cu, Ti/Au, Mo/Al/Mo, ITO/Ag/ITO, TiN/Ti/Al/Ti, TiN/Ti/Cu/Ti, or the like, and may include various conductive materials having multi-layered structures as well as the above-described multiple layers. In one embodiment, for example, at least one electrode of the first transistor M1, the second transistor M2, and/or the storage capacitor Cst may include a conductive polymer such as polythiophene-based, polypyrrole-based, polyaniline-based, polyacetylene-based, and polyphenylene-based compounds, mixtures thereof, and the like, and may include a PEDOT/PSS compound among the polythiophene-based compounds. In one embodiment, for example, at least one electrode of the first transistor M1, the second transistor M2, and/or the storage capacitor Cst may include a conductive metal oxide such as indium in oxide ("ITO"), indium zinc oxide ("IZO"), aluminum zinc oxide ("AZO"), indium tin zinc oxide ("ITZO"), ZnO, $SnO_2$, and the like. In one embodiment, for example, at least one electrode of the first transistor M1, the second transistor M2, and/or the storage capacitor Cst may include a material capable of providing conductivity. In an embodiment, the structure of an individual electrode constituting the first transistor M1, the second transistor M2, and/or the storage capacitor Cst is not particularly limited, each electrode may be variously modified in a single layer or multiple layers.

In some embodiments, at least one of the first and second active layers 152 and 154 may include an oxide semiconductor. In one embodiment, for example, the first active layer 152 and/or the second active layer 154 may include or be formed of an oxide of a metal such as In, Ga, Zn, Sn, or Ti, or a combination of a metal such as In, Ga, Zn, Sn, or Ti and an oxide thereof. In one embodiment, for example, the first active layer 152 and/or the second active layer 154 may include an oxide semiconductor such as ZnO, zinc tin oxide ("ZTO"), zinc indium oxide ("ZIO"), IZO, InO, TiO, indium gallium zinc oxide ("IGZO"), indium zinc tin oxide ("IZTO"), and the like, and the oxide semiconductor may be partially crystallized. In one embodiment, for example, the active layer 152 and/or the active layer 154 of the first transistor M1 and/or the second transistor M2 may include a material capable of constituting a channel layer. In one embodiment, for example, at least one of the first and second active layers 152 and 154 may include or be formed of amorphous or polycrystalline silicon, etc.

In some embodiments, the first electrode 122 and the second gate electrode 124 may be provided or formed using a same material by a same process. In one embodiment, for example, the first electrode 122 and the second gate electrode 124 may include a first metal layer including or made of a same material.

In some embodiments, the spacer 130 is integrally formed in a pixel circuit area, in which the first and second transistors M1 and M2 and the storage capacitor Cst are formed, and may including portions having different heights or thicknesses from each other. In one embodiment, for example, the spacer 130 may have the first height H1 or the second height H2 for each region.

In an embodiment, a half-tone mask may be used to pattern the single spacer 130 to a different height for each region through a single mask process. In such an embodiment, since the spacer 130 has the first height H1 at least in a region in which the first electrode 122 and the second electrode 142 overlap with each other and has the second height H2 lower than the first height H1 at least in a region in which the second gate electrode 124 and the second active layer 154, the spacer 130 may be patterned to different height for each region using the half-tone mask. However, the disclosure is not limited thereto. In one embodiment, for example, a mask process may be performed at least twice to pattern the spacer 130 to have different heights for each region.

In some embodiments, the second electrode 142 and the first storage electrode 144 may be provided or formed using a same material by a same process. In one embodiment, for example, the second electrode 142 and the first storage electrode 144 may include a second metal layer including or made of a same material.

In some embodiments, the first active layer 152 and the second active layer 154 may be provided or formed using a same material by a same process. In one embodiment, for example, the first active layer 142 and the first storage electrode 144 may include the same oxide semiconductor.

In some embodiments, the first gate electrode 172, the second storage electrode 174, the third electrode 176, and the fourth electrode 178 may be provided or formed using a same material by a same process. In one embodiment, for example, the first gate electrode 172, the second storage electrode 174, the third electrode 176, and the fourth electrode 178 may include a third metal layer including or made of a same material.

In embodiments of the disclosure, as described above, each of the first active layer 152 and the second active layer 154 is disposed on a line extending in a direction intersecting the base substrate 100 to constitute a vertical channel. According to such embodiments of the disclosure, the channel length of the first transistor M1 and/or the second transistor M2 may be secured along a vertical direction or oblique direction intersecting the base substrate 100. Thus, the area occupied by the first transistor M1 and/or the second transistor M2 in the pixel area may be reduced. In such embodiments, since the channel length of the first transistor M1 and/or the second transistor M2 may be easily adjusted by adjusting the height of the spacer 130, a short channel transistor may be easily formed. According to embodiments of the disclosure, the first transistor M1 and/or the second transistor M2 are/is a vertical thin film transistor(s), such that the pixel area may be effectively reduced. Accordingly, such embodiments of a thin film transistor array may be applied to high-resolution display devices, and the like. In such an embodiment of thin film transistor array, where the first transistor M1 and/or the second transistor M2 are/is configured as a vertical transistor(s), a change in characteristic of the first transistor M1 and/or the second transistor M2 hardly occurs or slightly occurs even in deformation such as bending or folding, as compared with a conventional thin film transistor array including a horizontal thin film transistor in which a channel layer is substantially horizontally disposed. Thus, such embodiments of a thin film transistor array may be effectively applied to flexible display devices, and the like.

Also, in the embodiment of the present, the first electrode 122, the second electrode 142, the first gate electrode 172, and the like are disposed by being stacked in different layers. By using a space secured as described above, a dummy line and/or an auxiliary line can be easily formed in the same layer as the first electrode 122, the second electrode 142, the first gate electrode 172, and the like. In one embodiment, for example, in a process of providing the first electrode 122, the second electrode 142 and/or the first gate electrode 172, an auxiliary power source line (e.g., an auxiliary high power source ELVDD line and/or an auxiliary low power source ELVSS line) may be provided in a corresponding layer. in such an embodiment, a pixel may have a structure desired in line formation. According to embodiments of the disclosure, a signal delay that may be generated in a display panel may be easily reduced, and an image having uniform image quality may be displayed.

In embodiments of the disclosure, the first storage electrode 144 and the second storage electrode 174, which constitute the storage capacitor Cst, are integrally formed with the second electrode 142 and the first gate electrode 172, which constitute the first transistor M1, respectively. According to embodiments of the disclosure, at least region of the storage capacitor Cst may overlap with the first transistor M1, when viewed from a top plan view. Accordingly, such embodiments of the disclosure may be usefully applied to high-resolution display devices, and the like.

In embodiments of the disclosure, the spacer 130 may be defined by or configured as an organic layer. In such embodiments, the pixel area may be planarized.

Figure 4:
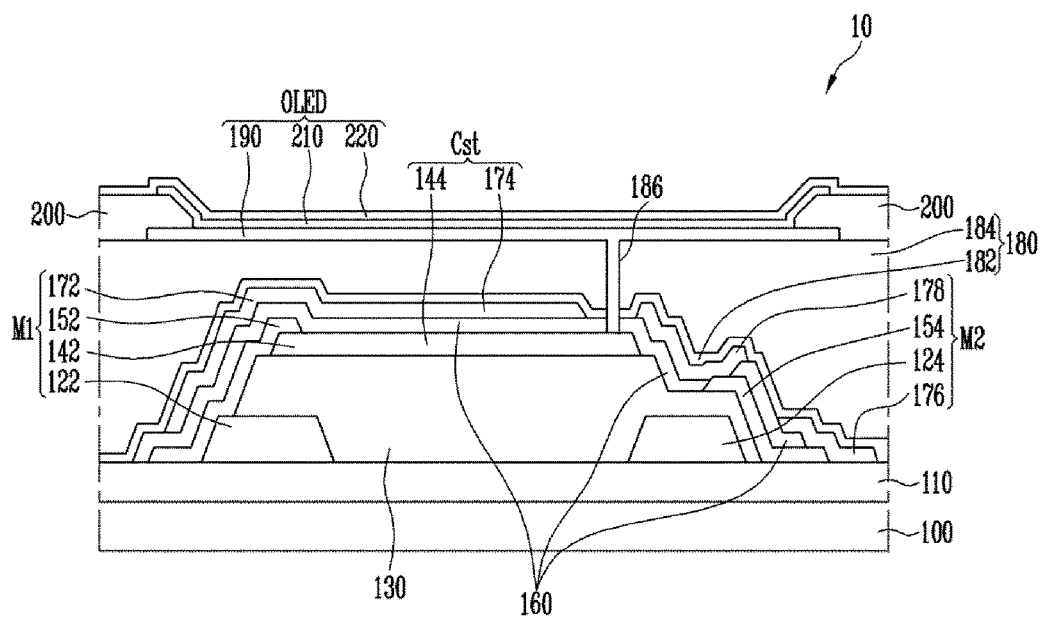
FIG. 4 is a sectional view illustrating one area, e.g., an individual pixel area, of a thin film transistor array substrate according to an embodiment of the disclosure.

FIG. 4 is a sectional view illustrating an area, e.g., an individual pixel area of a thin film transistor array substrate according to an embodiment of the disclosure. FIG. 4 illustrates a structure of a portion of the thin film transistor array substrate disposed between a pixel circuit part and a pixel electrode (or a light emitting device including the pixel electrode), which constitute each pixel. Particularly, FIG. 4 illustrates an embodiment in which the pixel electrode overlaps with the pixel circuit part. For convenience, components similar or identical to those of FIG. 3 are designated by like reference numerals, and any repetitive detailed descriptions thereof will be omitted.

Referring to FIG. 4, in some embodiments, the pixel circuit part including the first and second transistors M1 and M2 and the storage capacitor Cst may be covered by a second insulating layer 180. In such embodiments, a light emitting device OLED including a pixel electrode 190 and a pixel defining layer 200 may be disposed on the second insulating layer 180. In such embodiments, the light emitting device OLED may be disposed over the pixel circuit part to overlap with at least one of the first and second transistors M1 and M2 and the storage capacitor Cst, when viewed from a top plan view.

In some embodiments, the second insulating layer 180 may include an inorganic layer 182 and an organic layer 184. In one embodiment, for example, the second insulating layer 180 may include an inorganic insulating material or organic insulating material such as SiOx, SiNx, SiON, SiOF, AlOx, and the like, and may have a single layer structure or a multi-layer structure including at least one of these materials.

In some embodiments, the inorganic layer 182 may include an inorganic insulating material such as SiOx or SiNx, but the disclosure is not limited thereto. In such an embodiment, the inorganic layer 182 may include a well-known inorganic insulating material as well as SiOx or SiNx. The inorganic layer 182 may effectively prevent an impurity element such as moisture or hydrogen from penetrating into the pixel circuit part.

In some embodiments, the organic layer 184 may include an organic insulating material such as an organic material including at least one of polyimide, polyester, acrylic resin, benzocyclobutene, phenol resin, and the like, or a stack structure thereof, but the disclosure is not limited thereto. In such an embodiment, the organic layer 184 may include a well-known organic insulating material in addition to the above-described materials. The organic layer 184 covers the pixel circuit part such that an upper portion of the pixel circuit part is planarized. In such an embodiment, where the upper portion of the pixel circuit part is planarized as described above, the light emitting device OLED may be easily provided on the pixel circuit part.

In an embodiment, where the light emitting device OLED is disposed on the second insulating layer 180 to overlap with the pixel circuit part when viewed from a top plan view, the light emitting device OLED may be electrically connected to the second electrode 142 of the first transistor 142 through a via hole 186 defined in the second insulating layer 180. The light emitting device OLED includes the pixel electrode 190 (e.g., an anode electrode), a light emitting layer 210, and a counter electrode 220 (e.g., a cathode electrode), which are sequentially stacked on the second insulating layer 180.

The pixel electrode 190 may be disposed on the pixel circuit part to overlap with at least one of the first and second transistors M1 and M2 and the storage capacitor Cst, when viewed from a top plan view. The pixel electrode 190 is electrically connected to the second electrode 142 through the via hole 186. In some embodiments, the pixel electrode 190 may include an electrode material.

In some embodiments, a display device having a structure in which the light emitting device OLED is disposed on the pixel circuit part to overlap with the pixel circuit part may be a top emission display device. In such embodiments, the pixel electrode 190 may include or be formed of a metal having high reflexibility. In one embodiment, for example, the pixel electrode 190 may include one or more conductive layers including at least one of a metal such as Ti, Cu, Mo, Al, Au, Cr, TiN, Ag, Pt, Pd, Ni, Sn, Co, Rh, Ir, Fe, Ru, Os, Mn, W, Nb, Ta, Bi, Sb or Pb, and an alloy such as MoTi or AlNiLa. In such embodiments, the pixel electrode 190 may have a multi-layer structure such as Ti/Cu, Ti/Au, Mo/Al/Mo, or ITO/Ag/ITO. In an embodiment, the material of the pixel electrode 190 may include a material capable of providing conductivity in addition to the above-described reflective metal.

In some embodiments, an edge of the pixel electrode 190 may be covered by the pixel defining layer 200. The pixel defining layer 200 may include a polymer, e.g., poly(methyl methacrylate) ("PMMA") and, polystyrene ("PS"), a polymeric derivative of a phenol group, acryl-based polymer, imide-based polymer, arylether-based polymer, amide-based polymer, fluorine-based polymer, p-xylene-based polymer, vinyl alcohol-based polymer, or a complex or compound thereof, but the disclosure is not limited thereto. In such embodiments, the pixel defining layer 200 may include various insulating materials as well as the above-described insulating material.

The light emitting layer 210 is disposed between the pixel electrode 190 and the counter electrode 220. In some embodiments, the light emitting layer 210 may be an organic light emitting layer including a well-known organic light emitting material, but the disclosure is not limited thereto.

The counter electrode 220 is disposed to cover at least an upper portion of the light emitting layer 210. In some embodiments, the counter electrode 220 may be entirely provided or formed in the active area AA of the thin film transistor array substrate 10. In some embodiments, the counter electrode 220 may include or be formed of a transparent conductive material through which light generated from the light emitting layer 210 is transmitted. The transparent conductive material of the counter electrode 220 may be a conductive metal oxide such as ITO, IZO, or ITZO. In addition to the above-described conductive metal oxide, a material capable of providing conductivity may be used as the material of the counter electrode 220. In an embodiment, where the counter electrode 220 is implemented to be transparent, a top emission or double sided display device may be implemented.

According to the embodiments, as described herein, the pixel electrode 190 is disposed to overlap with at least one of the first and second transistors M1 and M2 and the storage capacitor Cst, when viewed from a top plan view. Accordingly, the space of the pixel area may be efficiently utilized, thereby providing a pixel structure that be effectively applied to high-resolution display devices.

In such embodiments, the second insulating layer 180 including an inorganic layer 182 and an organic layer 184 is disposed on the pixel circuit part, such that an impurity element is effectively prevented from penetrating into the pixel circuit part, and the upper portion of the pixel circuit part may be effectively planarized.

Figure 5:
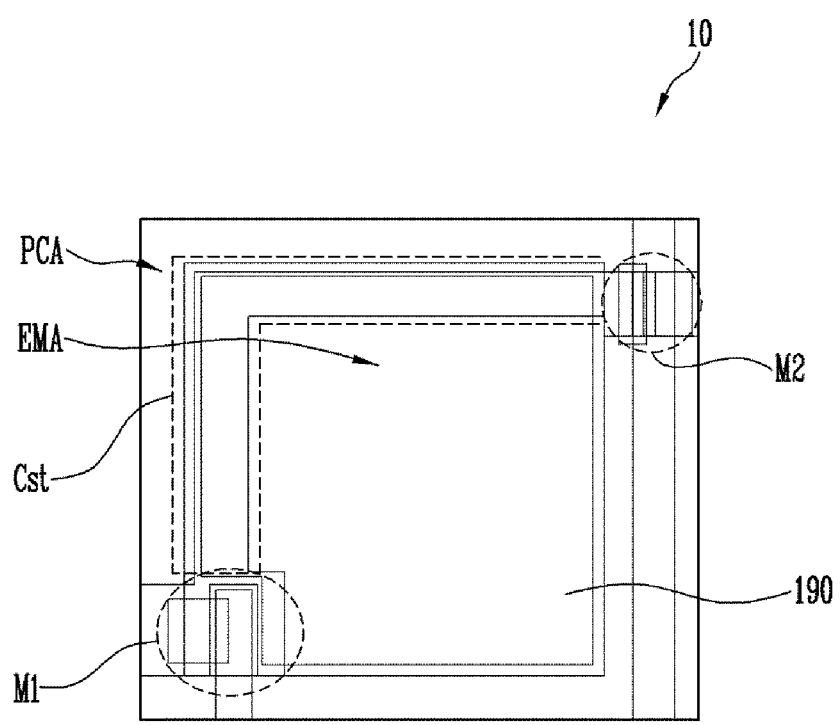
FIG. 5 is a plan view illustrating an area, e.g., an individual pixel area, of a thin film transistor array substrate according to an embodiment of the disclosure.

FIG. 5 is a plan view illustrating an area, e.g., an individual pixel area of a thin film transistor array substrate according to an embodiment of the disclosure. FIG. 5 illustrates a structure of a portion of the thin film transistor array substrate disposed between a pixel circuit part and a pixel electrode, which constitute each pixel. Particularly, FIG. 5 illustrates an embodiment in which the pixel electrode spatially separates a light emitting area and a pixel circuit area from each other not to overlap with the pixel circuit part.

Referring to FIG. 5, a pixel circuit area PCA, in which the pixel circuit part is disposed, and a light emitting area EMA, in which the pixel electrode 190 is disposed, may be disposed in each pixel area not to overlap with each other, when viewed from a top plan view. In one embodiment, for example, the pixel area may include the light emitting area EMA, in which the pixel electrode 190 is disposed, and the pixel circuit area PCA disposed at the circumference of the light emitting area EMA. In one embodiment, for example, the pixel electrode 190 may be disposed at a central portion of the pixel area, and the first and second transistors M1 and M2 and the storage capacitor Cst may be disposed at the circumference of the pixel electrode 190, e.g., at the periphery of the pixel electrode 190.

In an embodiment in which the light emitting area EMA is separated from the pixel circuit area PCA, the pixel electrode 190 may include or be formed of a same material and provided by a same process as at least one electrode constituting the first transistor M1 and/or the second transistor M2. In one embodiment, for example, the pixel electrode 190 may include a metal layer including or made of a same material as one of the first electrode 122, the second electrode 142 and the first gate electrode 172, and may be provided or formed by a process of providing one of the first electrode 122, the second electrode 142 and the first gate electrode 172. In one exemplary embodiment, for example, the pixel electrode 190 may be integrally connected to the first electrode 122 by being provided during a process of providing the first electrode 122. In such an embodiment, a fabricating process of the display device may be simplified, and the thickness of the display device may be decreased. However, the disclosure is not limited thereto. In one embodiment, for example, the pixel electrode 190 may include or be formed of a transparent conductive material, which may be different from the material constituting the first electrode 122, the second electrode 142 and the first gate electrode 172.

According to the embodiments described above, the light emitting area EMA and the pixel circuit area PCA are separated from each other, so that the light emitting direction of the display device may be variously selected. In one embodiment, for example, the light emitting direction of the display device may be easily controlled by merely selecting the material constituting the pixel electrode 190 and/or the counter electrode (220 of FIG. 4) overlapping therewith.

In one exemplary embodiment, for example, when the pixel electrode 190 and the counter electrode 220 include or are formed of a conductive material having high transmittance, a double side display device may be implemented. Alternatively, the pixel electrode 190 may include or be formed of a conductive material having high transmittance, and the counter electrode 220 may include or be formed of a conductive material having high reflexibility, so that a bottom emission display device may be implemented. Alternatively, the pixel electrode 190 may include or be formed of a conductive material having high reflexibility, and the counter electrode 220 may include or be formed of a conductive material having high transmittance, so that a top emission display device may be implemented.

In some embodiments, at least one of the first and second transistors M1 and M2 may have a dual gate structure. In one embodiment, for example, the first gate electrode 172 constituting the first transistor M1 may be implemented as a dual gate electrode. In such an embodiment, where the first transistor M1, which controls driving current, has a dual gate structure, the first transistor M1 becomes strong against positive bias temperature stress ("PBTS"), thereby improving the reliability of the first transistor M1.

Figure 6:
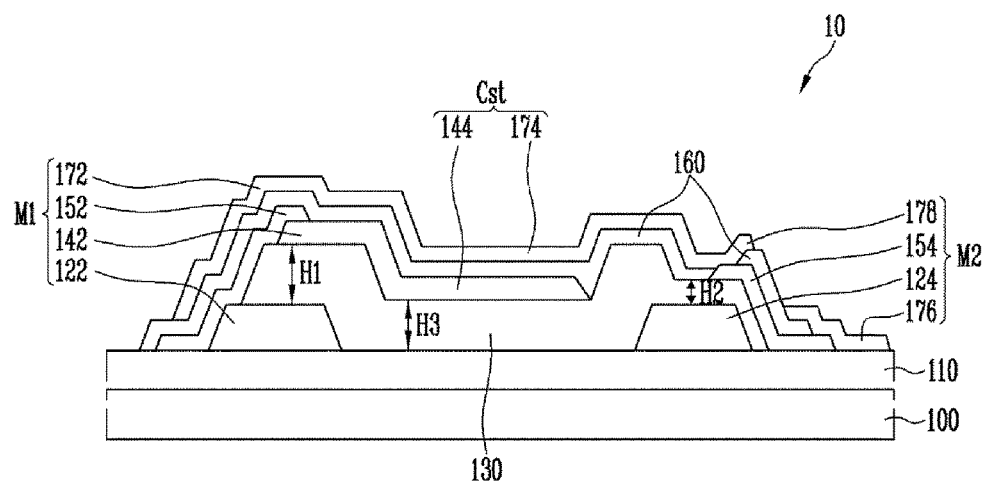
FIG. 6 is a sectional view illustrating an area of a thin film transistor array substrate according to an alternative embodiment of the disclosure.

FIG. 6 is a sectional view illustrating an area of a thin film transistor array substrate according to an alternative embodiment of the disclosure. In FIG. 6, components similar or identical to those of FIG. 3 are designated by like reference numerals, and any repetitive detailed descriptions thereof will be omitted.

Referring to FIG. 6, in some embodiments, a portion of the spacer 130 (e.g., an organic spacer) may be additionally etched in a region under the storage capacitor Cst. Alternatively, in some embodiments, where the spacer 130 includes an inorganic insulating layer, the space 130 may have a curve along the profile of a surface, e.g., an upper surface of the base substrate 100, on which the buffer layer 110, the first electrode 122 and the second gate electrode 124 are disposed. In such embodiments, the upper surface of the spacer 130 may have a step corresponding to the height of the first electrode 122 in the vicinity of the boundary of a region in which the first electrode 122 is disposed. In some embodiments, the spacer 130 may be partially etched such that a larger step is formed at the surface of the spacer 130.

In one embodiment, for example, the spacer 130 may be partially etched in the region under the storage capacitor Cst such that a height H3 of the spacer 130 is equal to or smaller than the first height H1 of the spacer 130 interposed between the first and second electrodes 122 and 142, or may include an inorganic insulating layer.

In such an embodiment, as a conductive layer (e.g., the second metal layer) constituting the second electrode 142 and the first storage electrode 144 has a curve along the profile of the surface of the spacer 130, one region of the conductive layer may be disposed at a position opposite to the first gate electrode 172 with the first active layer 152 interposed therebetween. Accordingly, in such an embodiment, the bottom metal layer 14 shown in FIG. 2A is effectively disposed in the first transistor M1, thereby improving output characteristics of the first transistor M1.

Figure 7:
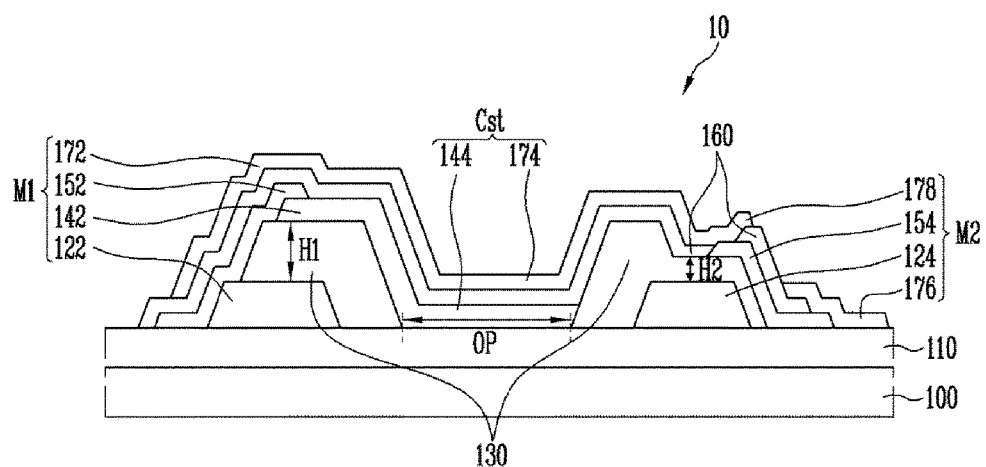
FIG. 7 is a sectional view illustrating an area of a thin film transistor array substrate according to another alternative embodiment of the disclosure.

FIG. 7 is a sectional view illustrating an area of a thin film transistor array substrate according to another alternative embodiment of the disclosure. In FIG. 7, components similar or identical to those of FIGS. 3 and 6 are designated by like reference numerals, and any repetitive detailed descriptions thereof will be omitted.

Referring to FIG. 7, in some embodiments, the spacer 130 may be partially removed in at least one region under the storage capacitor Cst. In such embodiments, an opening OP is defined in the spacer 130 in a region corresponding to the region under the storage capacitor Cst. In such embodiments, the first storage electrode 144 may be disposed to directly contact the surface of the base substrate 100, on which the buffer layer 110 is disposed.

In such an embodiment, although not shown in the sectional view of FIG. 7, the light emitting area EMA and the pixel circuit area PCA may be spatially separated from each other as described above with reference to FIG. 5, the spacer 130 may be partially removed even in the light emitting area EMA. In one embodiment, for example, in some embodiments, the spacer 130 may be partially opened corresponding to one region in which the storage capacitor Cst is disposed in the pixel circuit area PCA and the light emitting area EMA. In such an embodiment, the light emitting device OLED is disposed closer to one of both surfaces of the display panel, from which light is emitted, so that a pixel structure in bottom emission may be improved.

Such a structure described above may be applied to the double sided or top emission display device. In an embodiment, as described in FIG. 5, the material constituting the pixel electrode 190, etc. is controlled, so that the light emitting direction of the display device may be easily controlled.

Figure 8:
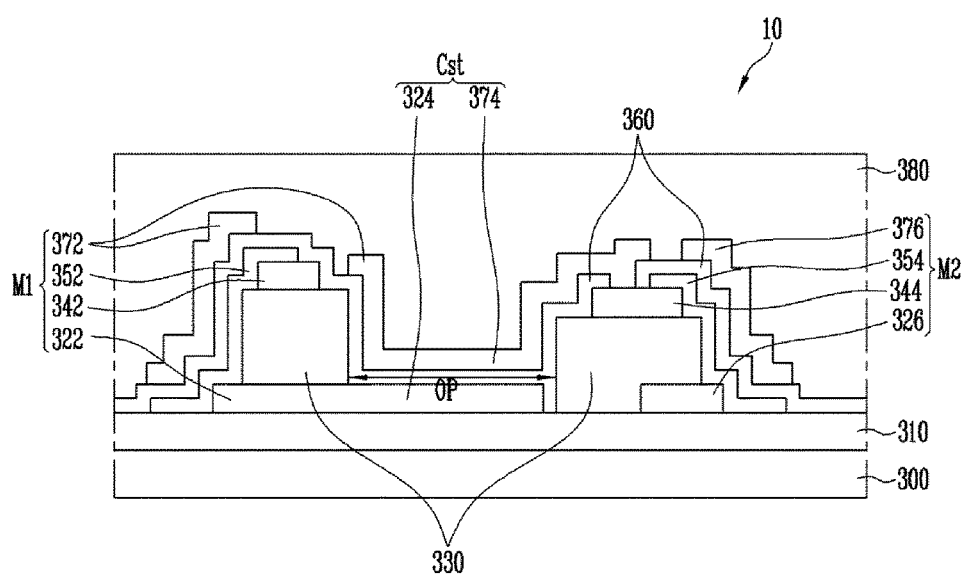
FIG. 8 is a sectional view illustrating an area of a thin film transistor array substrate according to another alternative embodiment of the disclosure.

FIG. 8 is a sectional view illustrating an area of a thin film transistor array substrate according to another alternative embodiment of the disclosure. In FIG. 8, components similar or identical to those of FIGS. 3 to 7 are designated by like reference numerals, and any repetitive detailed descriptions thereof will be omitted or simplified.

Referring to FIG. 8, an embodiment of the thin film transistor array substrate 10 may include a base substrate 300, and first and second transistors M1 and M2 and a storage capacitor Cst, which are disposed on a surface (e.g., the upper surface) of the base substrate 300. In some embodiments, the first and second transistors M1 and M2 and the storage capacitor Cst may be disposed in each pixel area defined in an active area AA of the base substrate 300.

In some embodiments, a buffer layer 310 may be disposed on the surface of the base substrate 300. In such embodiments, the first transistor M1, the second transistor M2 and the storage capacitor Cst may be disposed on the surface of the base substrate 300, on which the buffer layer 310 is disposed. In some embodiments, at least two of the first transistor M1, the second transistor M2 and the storage capacitor Cst may be disposed to overlap with each other in at least one region, when viewed from a top plan view, or may be formed to have at least one integrated electrode.

The first transistor M1 includes a first electrode 322, a spacer 330, a second electrode 342, a first active layer 352 and a first gate electrode 372, which are disposed on one region of the base substrate 300. In some embodiments, the first electrode 322 and the second electrode 342 may be sequentially stacked on the surface of the base substrate 300 with the spacer 330 interposed therebetween, and the first active layer 352 may be connected between the first electrode 322 and the second electrode 342. In an embodiment of the disclosure, the first transistor M1 may be a vertical TFT. In such an embodiment, the first gate electrode 372 may be disposed to be opposite to the second active layer 352 with a first insulating layer 360 interposed therebetween.

In some embodiments, the first electrode 322 may be a source electrode, but the disclosure is not limited thereto. In one embodiment, for example, the first electrode 322 may be a drain electrode depending on the type of the first transistor M1 and/or the direction of a voltage applied to the first transistor M1. The first electrode 322 may be electrically connected to a first storage electrode 324. In one embodiment, for example, the first electrode 322 may be integrally connected to the first storage electrode 324.

In an embodiment, one region of the spacer 330 may be interposed between the first electrode 322 and the second electrode 342. In such an embodiment, another region of the spacer 330 is interposed between a third electrode 326 and a fourth electrode 344, which constitute the second transistor M2. In some embodiments, an opening OP may be defined in the spacer 330 to correspond to the region in which the storage capacitor Cst is disposed. In some embodiments, the spacer 330, for example, may be opened even in a light emitting area EMA as shown in FIG. 5. The spacer 330 may include at least one of an organic layer and an inorganic layer.

In some embodiments, the second electrode 342 is disposed on the first electrode 322 such that at least one region of the second electrode 342 overlaps with the first electrode 322, and may be spaced apart from the first electrode 322 at a predetermined distance by the spacer 330. In some embodiments, the second electrode 342 may be a drain electrode, but the disclosure is not limited thereto. In one embodiment, for example, the second electrode 342 may be a source electrode depending on the type of the first transistor M1 and/or the direction of a voltage applied to the first transistor M1. The second electrode 342 may be connected to the first power source ELVDD through a first power source line (not shown).

In some embodiments, the first active layer 352 may extend in a direction intersecting the base substrate 300 via a plurality of layers in which the first electrode 122, the spacer 130 and the second electrode 142 are respectively disposed. In one embodiment, for example, the first active layer 352 may be connected between the first electrode 322 and the second electrode 342 via one region of the side surface of the spacer 130, particularly, a side surface between the first electrode 322 and the second electrode 342.

In such an embodiment, the first active layer 352 may be disposed on a line extending in a direction intersecting the base substrate 300 to constitute a vertical channel. In such an embodiment, where the vertical channel is defined as described above, an area occupied by the first transistor M1 in the pixel area may be reduced, and a sufficient channel length desired to ensure characteristics of the first transistor M1 may be secured.

In some embodiments, the first insulating layer 360 is interposed at least between the first active layer 352 and the first gate electrode 372. In such embodiments, the first insulating layer 360 may be integrally formed at least in the pixel area to be also interposed between the first storage electrode 324 and a second storage electrode 374 and between a second active layer 354 and a second gate electrode 376. In one embodiment, for example, the first insulating layer 360 may be integrally formed over the entire active area AA. The first insulating layer 360 may be partially opened in a region in which an electrical connection between two conductive layers is desired via a layer in which the first insulating layer 360 is disposed. In some embodiments, the first insulating layer 360 may include an inorganic layer and/or an organic layer.

In some embodiments, the first gate electrode 372 is opposite to the first active layer 352 with the first insulating layer 360 interposed therebetween. In some embodiments, the first gate electrode 372 may be implemented as a dual gate electrode. The first gate electrode 372 may be connected to the second storage electrode 374. In one embodiment, for example, the first gate electrode 372 may be integrally connected to the second storage electrode 374.

The storage capacitor Cst includes the first storage electrode 324 and the second storage electrode 374, which are opposite to each other with the first insulating layer 360 interposed therebetween. In some embodiments, the storage capacitor Cst may be disposed to contact the buffer layer 310 on the surface of the base substrate 300, but the disclosure is not limited thereto.

In some embodiments, the first storage electrode 324 may be electrically connected to the first electrode 322. In one embodiment, for example, the first storage electrode 324 may be integrally connected to the first electrode 322.

In some embodiments, the second storage electrode 374 may be electrically connected to the first gate electrode 372. In one embodiment, for example, the second storage electrode 374 may be integrally connected to the first gate electrode 372.

The second transistor M2 is electrically connected to the storage capacitor Cst. In one embodiment, for example, the second transistor M2 may be electrically connected to the second storage electrode 374 through the fourth electrode 344.

In such an embodiment, the second transistor M2 may have a vertical structure substantially similar to that of the first transistor M1. In one embodiment, for example, the third and fourth electrodes 326 and 344 of the second transistor M2 may be sequentially stacked on the one surface of the base substrate 300 with the spacer 330 interposed therebetween. The third electrode 326 and the fourth electrode 344 may be spaced apart from each other at a predetermined distance by the spacer 330. In some embodiments, the second active layer 354 may be connected in the vertical direction between the third electrode 326 and the fourth electrode 344. In such embodiments, like the first transistor M1, the second transistor M2 may use the first insulating layer 360 as a gate insulating layer.

In an embodiment in which the light emitting area EMA and the pixel circuit area PCA are separated from each other as described with reference to FIG. 5, a pixel defining layer 380 may be disposed over the first and second transistors M1 and M2 and the storage capacitor Cst. In one embodiment, for example, the first and second transistors M1 and M2 and the storage capacitor Cst may be covered by the pixel defining layer 380 including an organic insulating material.

In some embodiments, each of the electrodes constituting the first transistor M1, the second transistor M2 and/or the storage capacitor Cst may include at least one of metals, alloys thereof, conductive polymers, and conductive metal oxides. In some embodiments, at least one of the first and second active layers 352 and 354 may include an oxide semiconductor.

In some embodiments, the first electrode 322, the first storage electrode 324 and the third electrode 326 may include or be formed of a same material and may be provided by a same process. In one embodiment, for example, the first electrode 322, the first storage electrode 324 and the third electrode 326 may include or be defined by a first metal layer.

In some embodiments, the second electrode 342 and the fourth electrode 344 may include or be formed of a same material and may be provided by a same process. In one embodiment, for example, the second electrode 342 and the fourth electrode 344 may include or be defined by a second metal layer.

In some embodiments, the first active layer 352 and the second active layer 354 may include or be formed of a same material and may be provided by a same process. In one embodiment, for example, the first active layer 352 and the second active layer 354 may include a same oxide semiconductor as each other.

In some embodiments, the first gate electrode 372, the second storage electrode 374 and the second gate electrode 376 may include or be formed of a same material and may be provided by a same process. In one embodiment, for example, the first gate electrode 372, the second storage electrode 374 and the second gate electrode 376 may include or be defined by a third metal layer.

According to an embodiment, as described above, the first and second transistors M1 and M2 are configured as vertical transistors. Accordingly, channel lengths of the first and second transistors M1 and M2 may be sufficiently secured, and an area occupied by the first and second transistors M1 and M2 in the pixel area may be reduced. In such an embodiment, channel widths of the first and second transistors M1 and M2 may be effectively secured or each channel may be effectively divided.

In such an embodiment, the first transistor M1 may be implemented in a dual gate structure. Accordingly, the first transistor M1 becomes strong against PBTS, thereby improving the reliability of the first transistor M1.

In such an embodiment, the first gate electrode 372 and the second storage electrode 374 may be defined by an opaque third metal layer, and one region of the third metal layer may be provided or formed along the profile of a sidewall of the spacer 330. In such an embodiment, the first electrode 322 and the first storage electrode 324 may be defined by an opaque first metal layer. Accordingly, internal light generated in the pixel area (e.g., light generated in the light emitting area EMA as shown in FIG. 5) or external light introduced from the outside of the pixel area may be effectively prevented from being introduced into the first and second active layers 352 and 354. In such an embodiment, characteristics of the first and second active layers 352 and 354 including, for example, an oxide semiconductor material, may be effectively prevented from being changed by light, such that the reliability of the first and second transistors M1 and M2 is secured.

FIGS. 9A to 9I are plan views sequentially illustrating a fabricating method of a thin film transistor array substrate according to an embodiment of the disclosure. Particularly, like the embodiment shown in FIG. 8, FIGS. 9A to 9I illustrate an embodiment in which a pixel circuit part is defined, and a pixel circuit area in which the pixel circuit part is disposed and a light emitting area in which a pixel electrode is disposed are separated from each other. In order to clearly indicate components newly provided in a corresponding step, only components exposed in each step are designated by reference numerals, and components newly added in each step will be emphasized with shadow.

Figure 9A:
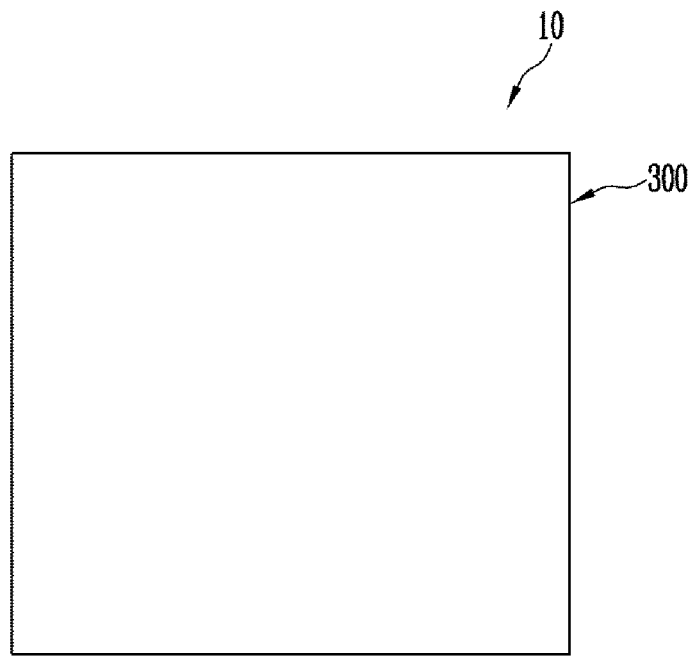
FIGS. 9A to 9I are plan views sequentially illustrating a fabricating method of a thin film transistor array substrate according to an embodiment of the disclosure.

An embodiment of the fabricating method of the thin film transistor array substrate 10 will be described in detail with reference to FIGS. 9A to 9I. First, as shown in FIG. 9A, a base substrate 300 is provided.

Figure 9B:
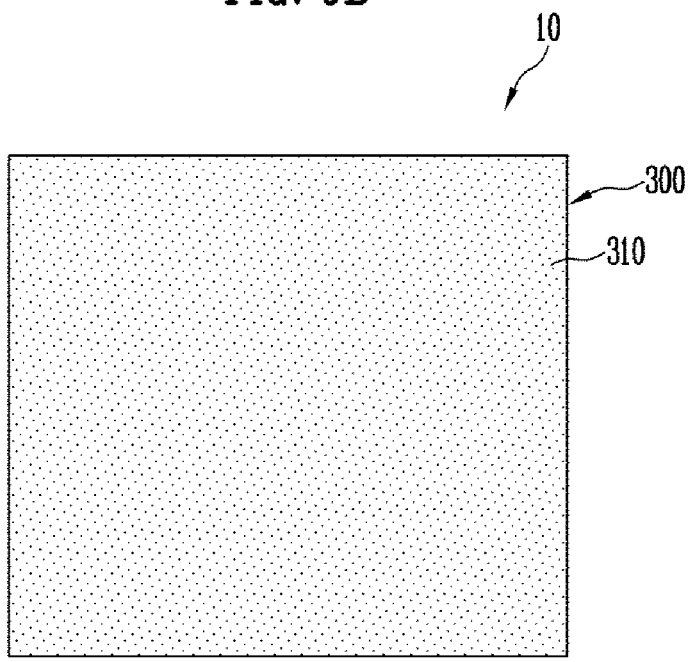

In such an embodiment, as shown in FIG. 9B, a buffer layer 310 is provided or formed on a surface of the base substrate 300.

Figure 9C:
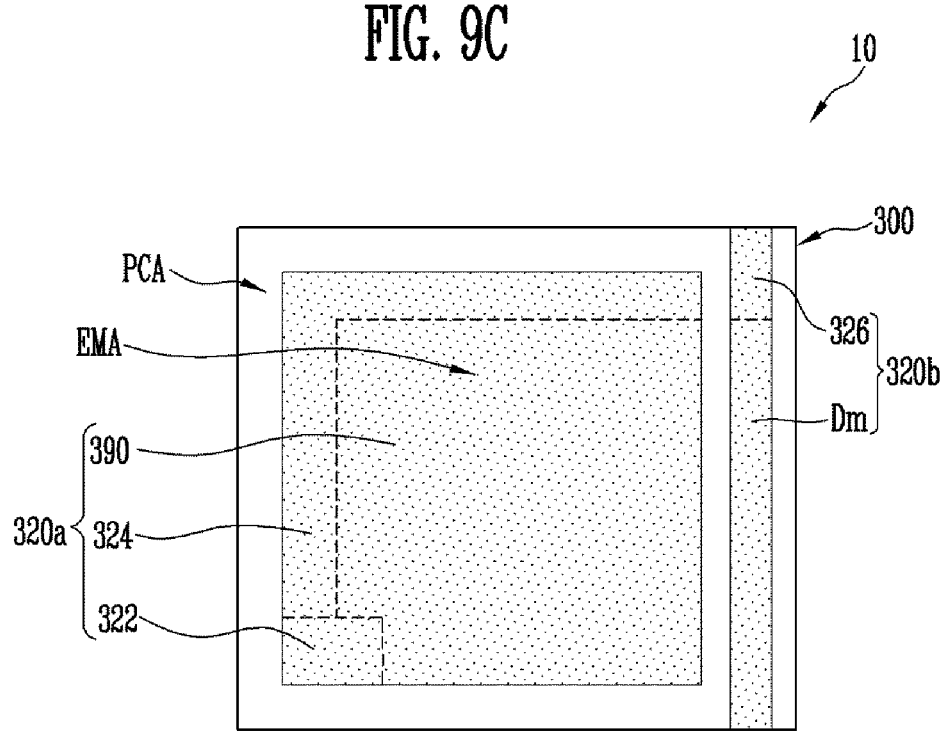

In such an embodiment, a first conductive layer (e.g., a first metal layer) is provided or formed on the surface of the base substrate 300, and a first pattern 320a and a second pattern 320b, which are separated from each other, are formed as shown in FIG. 9C by patterning the first conductive layer.

In some embodiments, the first pattern 320a is formed on one area of a pixel circuit area PCA and a light emitting area EMA. In some embodiments, the first pattern 320a may include a first electrode 322, a first storage electrode 324 and a pixel electrode 390, which are integrally connected to one another.

In some embodiments, the second pattern 320b is provided or formed on one area of the pixel circuit area PCA. In some embodiments, the second pattern 320b may include a third electrode 326 and a data line Dm, which are integrally connected to each other.

Figure 9D:
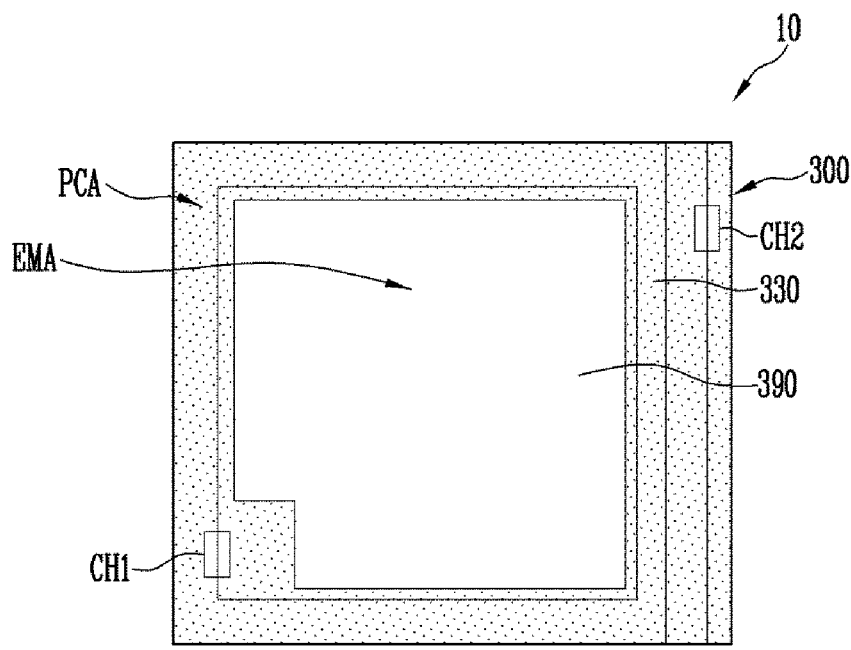

In such an embodiment, as shown in FIG. 9D, a spacer 330 is formed to cover at least one area of the pixel circuit area PCA while exposing the pixel electrode 390 disposed in the light emitting area EMA. In such an embodiment, first and second contact holes CH1 and CH2 are formed by partially removing a portion of the spacer 330 to expose regions of the first electrode 322 and the third electrode 326.

Figure 9E:
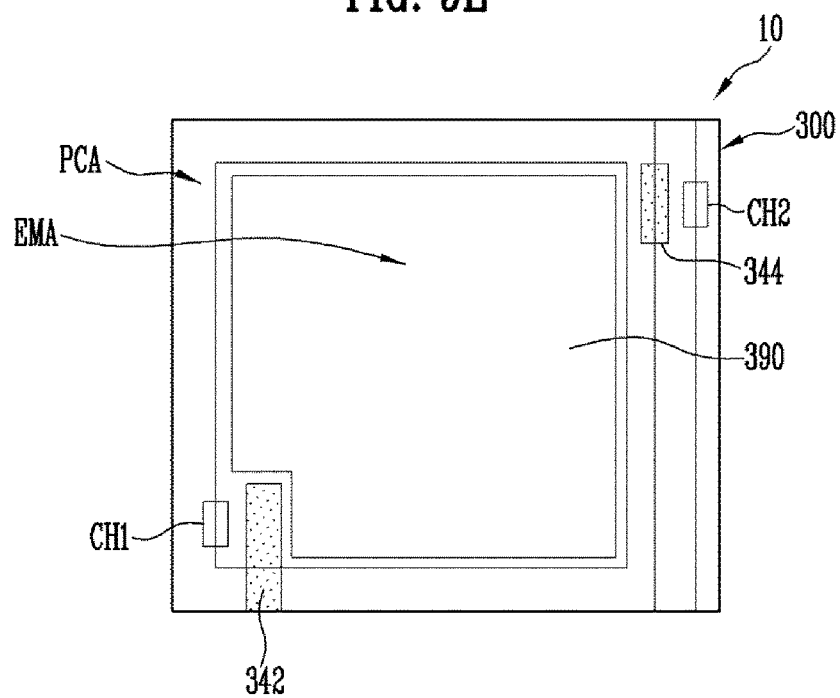

In such an embodiment, a second conductive layer (e.g., a second metal layer) is provided or formed on the surface of the base substrate 300, and a second electrode 342 and a fourth electrode 344 are formed as shown in FIG. 9E by patterning the second conductive layer.

Figure 9F:
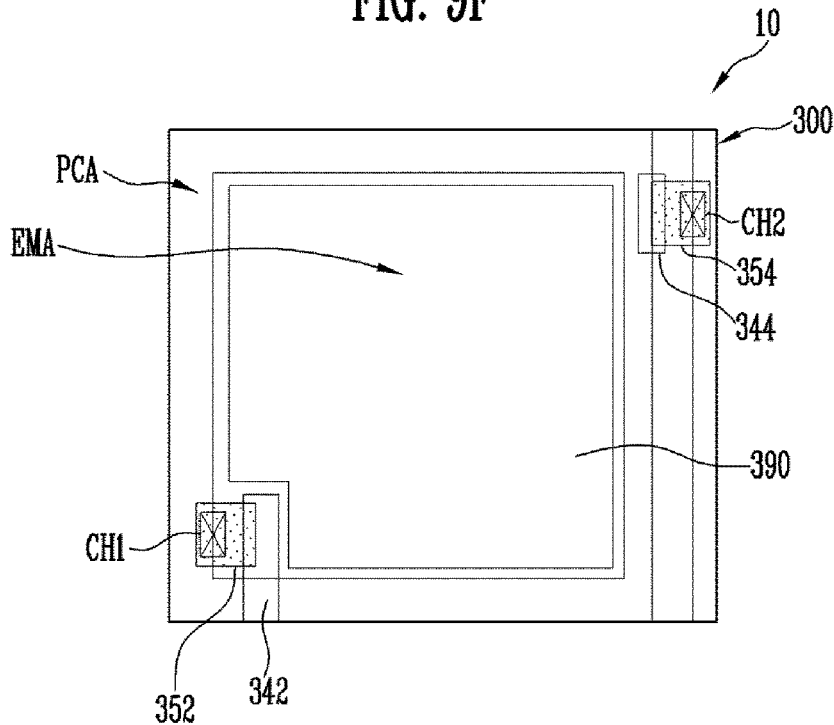

In such an embodiment, as shown in FIG. 9F, a first active layer 352 and a second active layer 354 are provided or formed on regions, in which the first contact hole CH1 and the second contact hole CH2 are formed, and one regions of the second electrode 342 and the fourth electrode 344, respectively. In some embodiments, the first active layer 352 is provided or formed on at least one region of the first electrode 322 and the second electrode 342 to cover the exposed region of the first electrode 322 and at least one region of the second electrode 342 via one region of the side surface of the spacer 330 as shown in FIG. 8 in the region in which the first contact hole CH1 is formed. In such embodiments, the second active layer 354 is provided or formed in at least one region of the third electrode 326 and the fourth electrode 344 to cover the exposed region of the third electrode 326 and at least one region of the fourth electrode 344 via one region of the side surface of the spacer 330 in the region in which the second contact hole CH2 is formed.

Figure 9G:
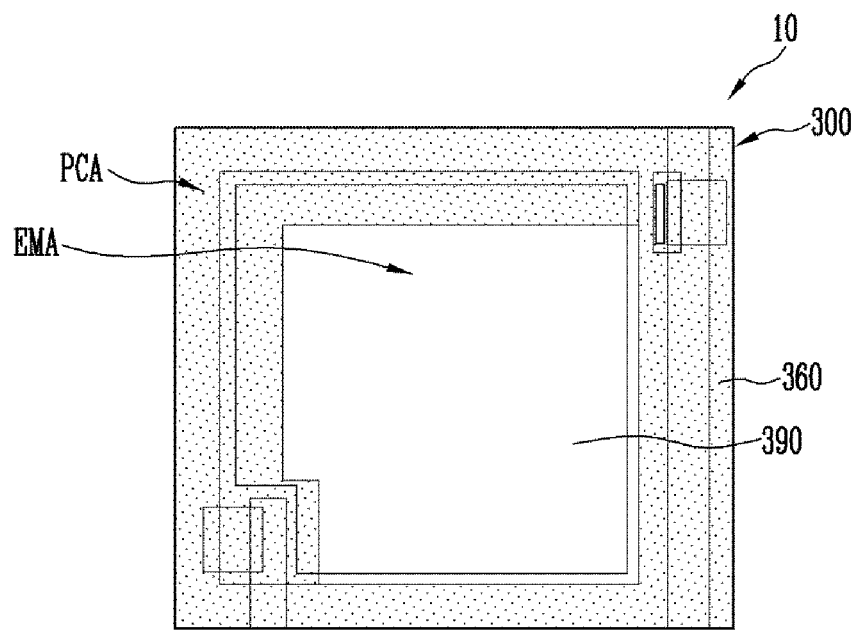

In such an embodiment, as shown in FIG. 9G, a first insulating layer 360 is provided or formed to cover at least the pixel circuit area PCA including upper portions of the first active layer 352 and the second active layer 354. In such an embodiment, the first insulating layer 360 is opened in the light emitting area EMA to expose at least one region of the pixel electrode 390. In such an embodiment, the first insulating layer 360 exposes at least one region of the fourth electrode 344. Accordingly, a second storage electrode 374 provided in a subsequent step is electrically connected to the fourth electrode 344.

Figure 9H:
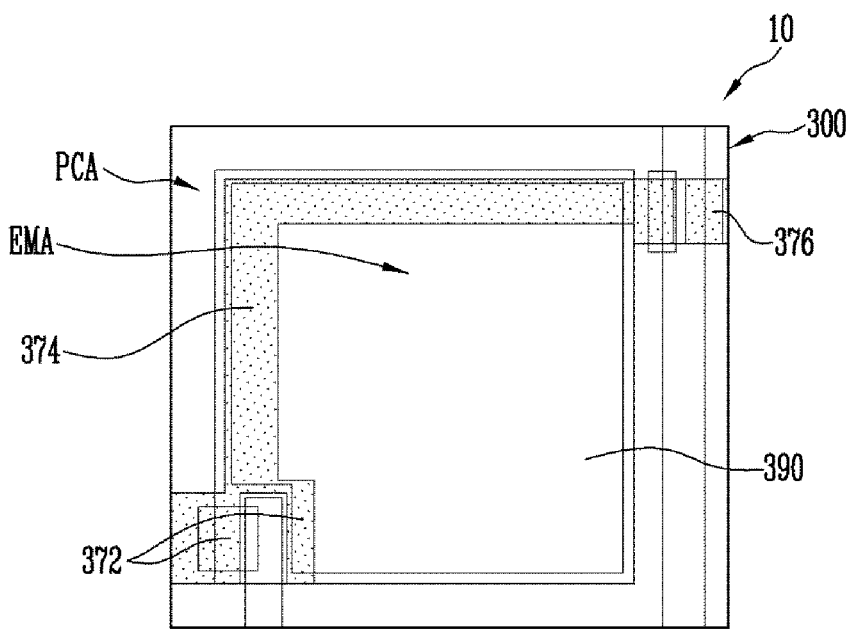

In such an embodiment, a third conductive layer (e.g., a third metal layer) is provided or formed in one region of the base substrate 300, in which the first insulating layer 360, and a first gate electrode 372, the second storage electrode 374 and a second gate electrode 376 are formed as shown in FIG. 9H by patterning the third conductive layer. In some embodiments, as shown in FIG. 8, the first gate electrode 372 is formed to be opposite to the first active layer 352 with the first insulating layer 360 interposed therebetween, and the second gate electrode 376 is formed to be opposite to the second active layer 354 with the first insulating layer 360 interposed therebetween. In some embodiments, the first gate electrode 372 may be formed as a dual gate electrode. In some embodiments, the second storage electrode 374 may be integrally connected to the first gate electrode 372.

Figure 9I:
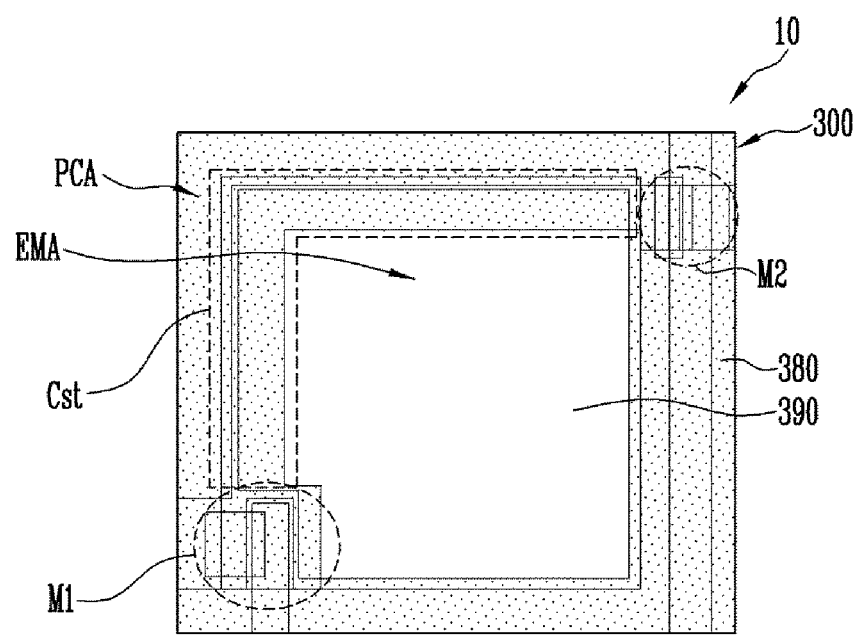

In such an embodiment, as shown in FIG. 9I, a pixel defining layer 380 that covers first and second transistors M1 and M2 and a storage capacitor Cst is provided or formed on at least the pixel circuit area PCA. In such an embodiment, the pixel defining layer 380 is opened in the light emitting area EMA to expose at least one region of the pixel electrode 390. Subsequently, a light emitting layer, a counter electrode, and the like, which are not shown, are provided or formed on the pixel electrode 390, thereby constituting a pixel.

In such an embodiment, the pixel electrode 390 may be simultaneously provided or formed together with the first electrode 322, using a same conductive material as the first electrode 322, e.g., the first metal layer. Accordingly, a fabricating process of the display device may be simplified, and the thickness of the display device may be decreased.

In such an embodiment, the pixel circuit area PCA and the light emitting area EMA are separated from each other, so that the light emitting direction of the display device may be easily controlled by merely selecting the material constituting the pixel electrode 390 and the counter electrode opposite thereto. Accordingly, the light emitting direction of the display device may be variously selected.

FIGS. 10A to 10I are plan views sequentially illustrating a fabricating method of a thin film transistor array substrate according to an alternative embodiment of the disclosure. In FIGS. 10A to 10I, any repetitive detailed descriptions of components similar or identical to those of FIGS. 9A to 9I will be omitted or simplified.

Figure 10A:
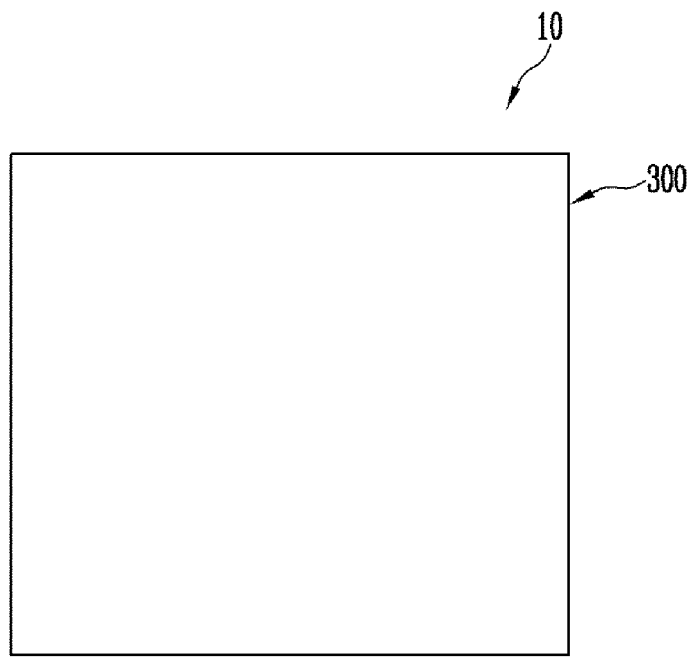
FIGS. 10A to 10I are plan views sequentially illustrating a fabricating method of a thin film transistor array substrate according to an alternative embodiment of the disclosure.

An embodiment of the fabricating method of the thin film transistor array substrate 10 will be described in detail with reference to FIGS. 10A to 10I. First, as shown in FIG. 10A, a base substrate 300 is provided.

Figure 10B:
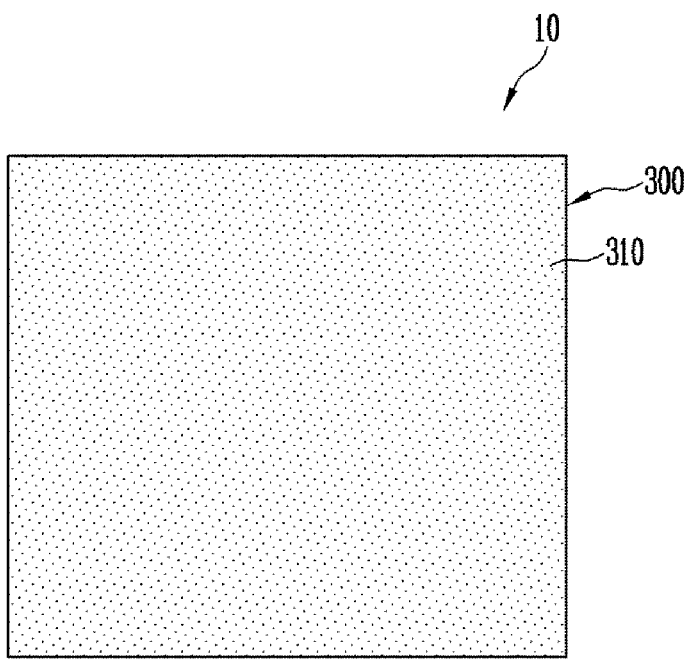

In such an embodiment, as shown in FIG. 10B, a buffer layer 310 is provided or formed on a surface of the base substrate 300.

Figure 10C:
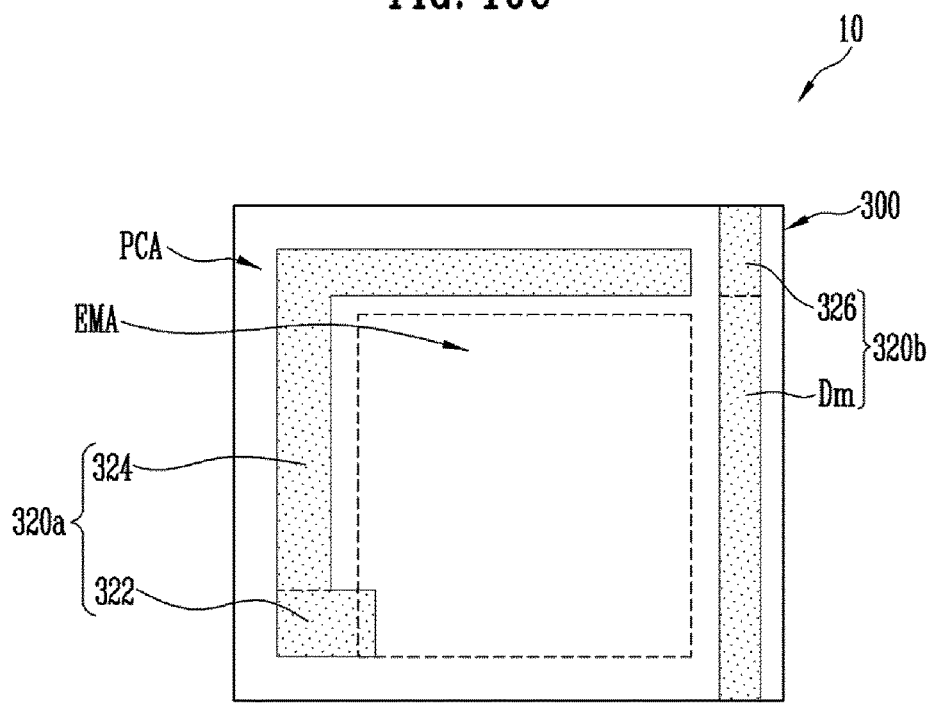

In such an embodiment, a first conductive layer (e.g., a first metal layer) is provided or formed on one region of the base substrate 300, in which the buffer layer 310 is provided, a first pattern 320*a* and a second pattern 320*b*, which are separated from each other, are formed as shown in FIG. 10C by patterning the first conductive layer. In some embodiments, the first pattern 320*a* and the second pattern 320*b* are formed in one area of a pixel circuit area PCA. In some embodiments, the first pattern 320*a* may include a first electrode 322 and a first storage electrode 324, which are integrally connected to each other, and the second pattern 320*b* may include a third electrode 326 and a data line Dm, which are integrally connected to each other. In such an embodiment, the first storage electrode 324 is simultaneously provided with the first electrode 322 in a process of providing the first electrode 322, but the disclosure is not limited thereto. In one embodiment, for example, the first storage electrode 324 may be simultaneously provided with the second electrode 342 in a process of providing the second electrode 342.

Figure 10D:
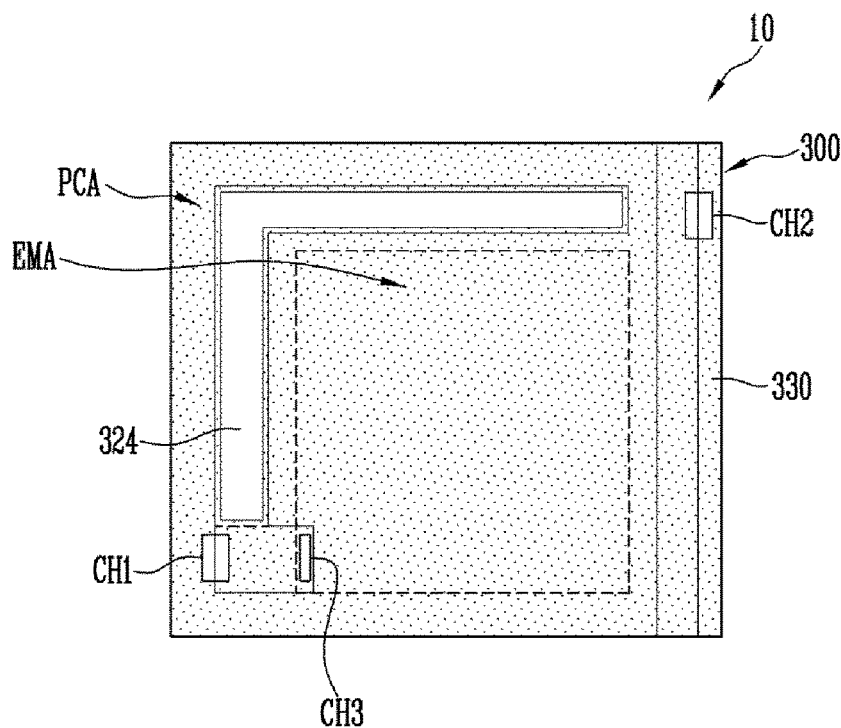

In such an embodiment, as shown in FIG. 10D, a spacer 330 is formed to cover the first electrode 322 and at least one region of the second pattern 320*b*. In such an embodiment, first to third contact holes CH1, CH2, and CH3 are formed through the spacer 330 on regions of the first electrode 322 and the third electrode 326. In such an embodiment, a light emitting area EMA may be covered by the spacer 330 as shown in FIG. 10D, but the disclosure is not limited thereto. In such embodiments, the spacer 330 may be opened to expose the light emitting area EMA.

Figure 10E:
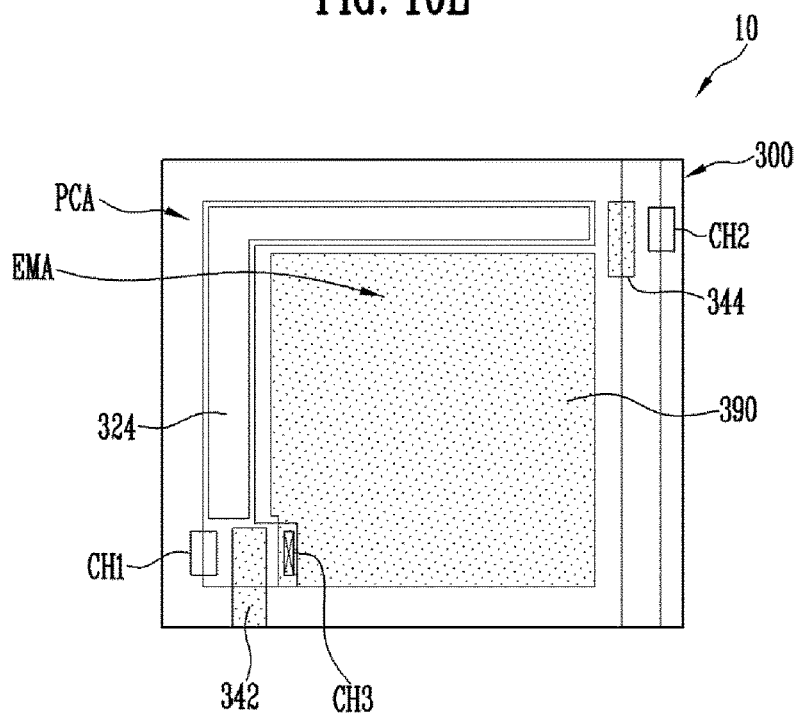

In such an embodiment, a second conductive layer (e.g., a second metal layer) is provided or formed on the surface of the base substrate 300, on which the spacer 330 is provided, and a second electrode 342 and a fourth electrode 344 are formed on the spacer 330 as shown in FIG. 10E by patterning the second conductive layer. In such an embodiment, a pixel electrode 390 may be formed on the light emitting area EMA by patterning the second conductive layer. In such an embodiment, the pixel electrode 390 may be electrically connected to the first electrode 322 through the third contact hole CH3.

Figure 10F:
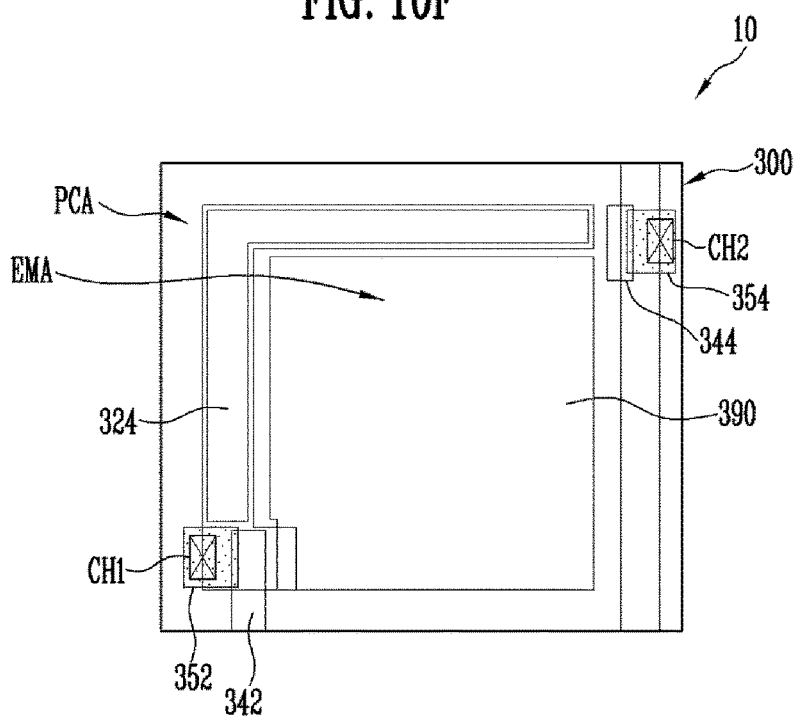

In such an embodiment, as shown in FIG. 10F, a first active layer 352 and a second active layer 354 are provided or formed on regions in which the first contact hole CH1 and the second contact hole CH2 are formed, respectively.

Figure 10G:
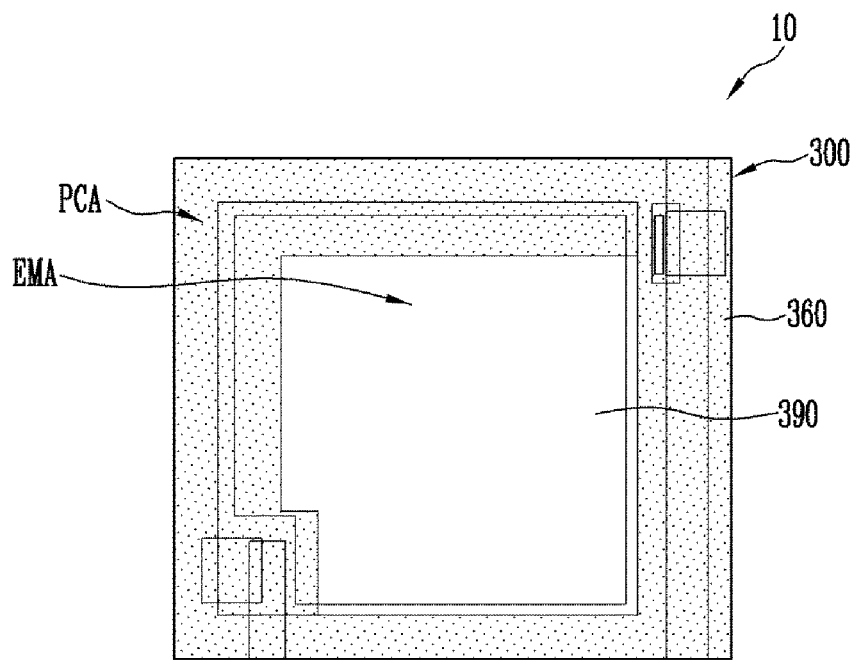

In such an embodiment, as shown in FIG. 10G, a first insulating layer 360 is provided or formed to cover at least the pixel circuit area PCA including upper portions of the first active layer 352 and the second active layer 354. In such an embodiment, the first insulating layer 360 is opened in the light emitting area EMA to expose at least one region of the pixel electrode 390. In such an embodiment, the first insulating layer 360 exposes at least one region of the fourth electrode 344. Accordingly, a second storage electrode 374 provided in a subsequent step is electrically connected to the fourth electrode 344.

Figure 10H:
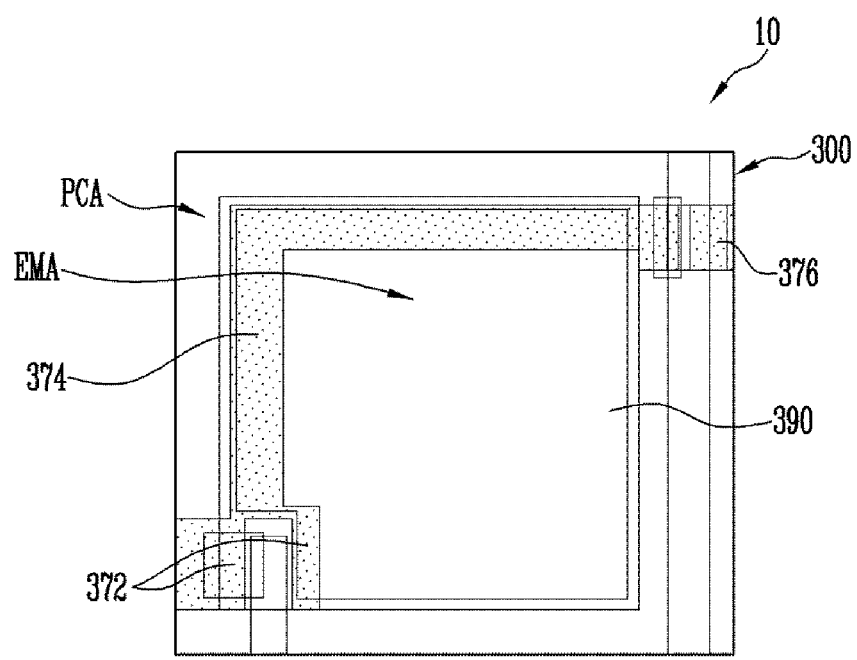

In such an embodiment, a third conductive layer (e.g., a third metal layer) is provided or formed on one region of the base substrate 300, in which the first insulating layer 360 is provided, and a first gate electrode 372, the second storage electrode 374 and a second gate electrode 376 are formed as shown in FIG. 10H by patterning the third conductive layer.

Figure 10I:
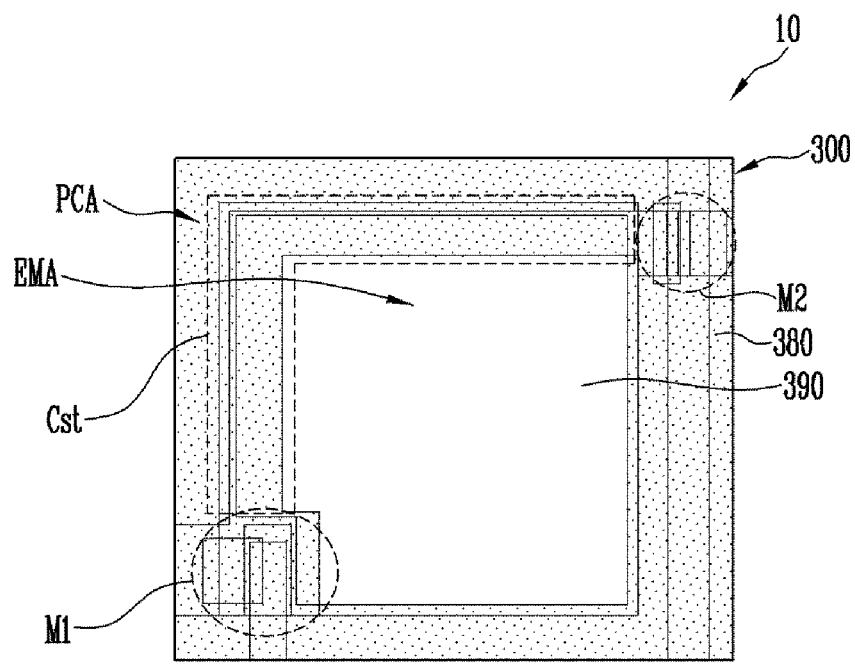

In such an embodiment, as shown in FIG. 10I, a pixel defining layer 380 that covers first and second transistors M1 and M2 and a storage capacitor Cst is formed on at least the pixel circuit area PCA. At this time, the pixel defining layer 380 is opened in the light emitting area EMA to expose at least one region of the pixel electrode 390. After that, a light emitting layer, a counter electrode, and the like, which are not shown, are formed on the pixel electrode 390, thereby constituting a pixel.

In such an embodiment, the pixel electrode 390 may be simultaneously formed with the second electrode 342, using a same conductive material as the second electrode 342, e.g., the second metal layer. Accordingly, a fabricating process of the display device may be simplified, and the thickness of the display device can be decreased. In such an embodiment, the pixel circuit area PCA and the light emitting area EMA are separated from each other, so that the light emitting direction of the display device may be variously modified.

FIGS. 11A to 11I are plan views sequentially illustrating a fabricating method of a thin film transistor array substrate according to another alternative embodiment of the disclosure. In FIGS. 11A to 11I, any repetitive detailed descriptions of components similar or identical to those of FIGS. 9A to 9I and 10A to 10I will be omitted or simplified.

First, as shown in FIGS. 11A to 11D, a buffer layer 310 is provided or formed on a surface of the base substrate 300. Subsequently, a first electrode 322, a first storage electrode 324, a third electrode 326 and a data line Dm are provided or formed on the buffer layer 310, and a spacer 330 is provided thereon. In the fabricating processes shown in FIGS. 11A to 11D are substantially identical to those shown in FIGS. 10A to 10D, and any repetitive detailed description thereof will be omitted.

Figure 11A:
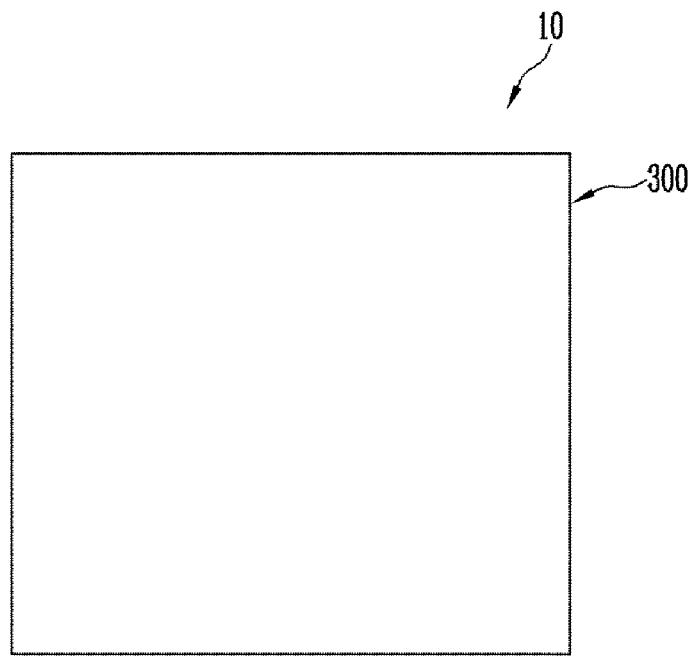
FIGS. 11A to 11I are plan views sequentially illustrating a fabricating method of a thin film transistor array substrate according to another alternative embodiment of the disclosure.
Figure 11B:
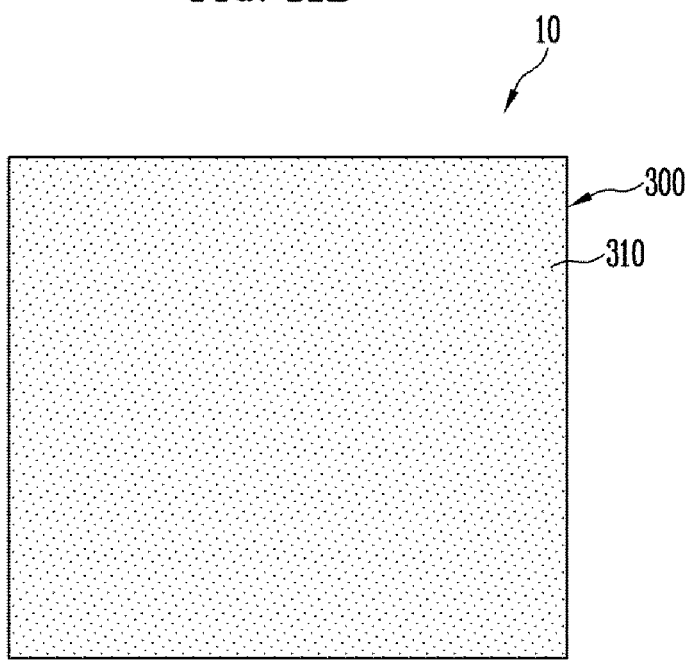
Figure 11C:
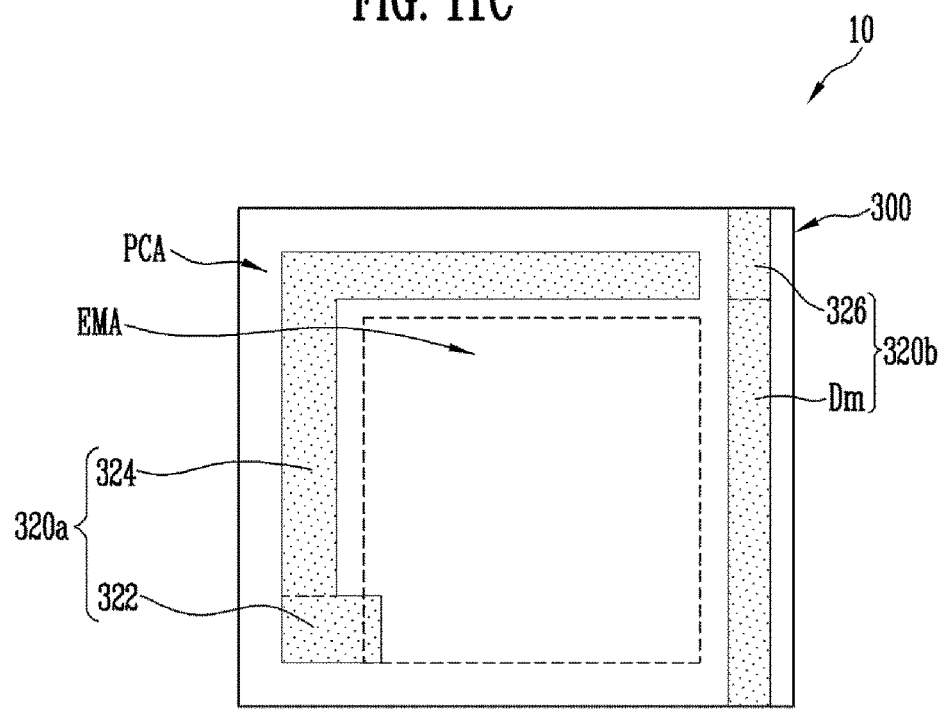
Figure 11D:
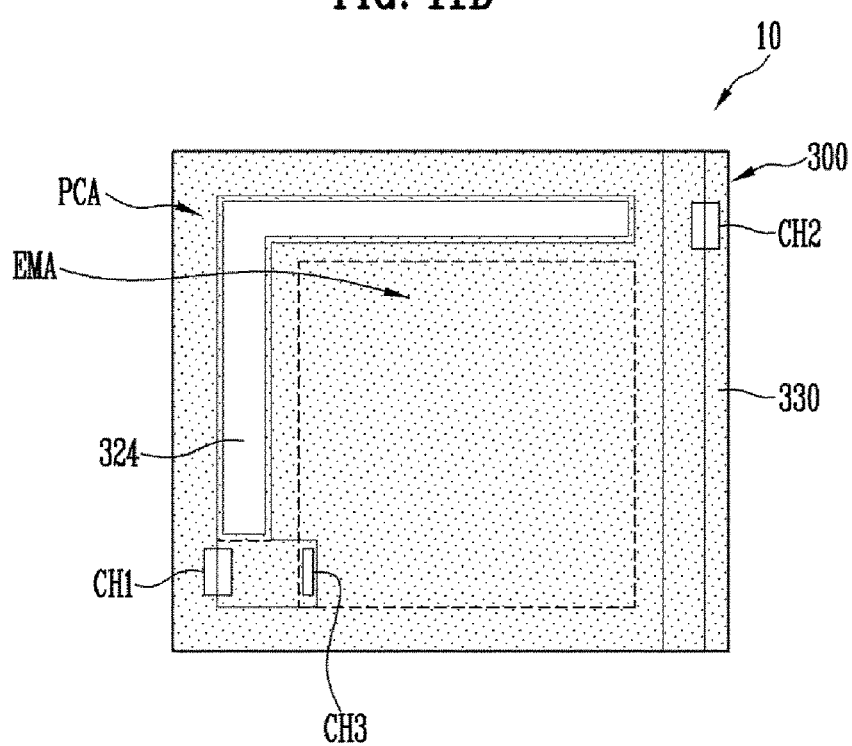
Figure 11E:
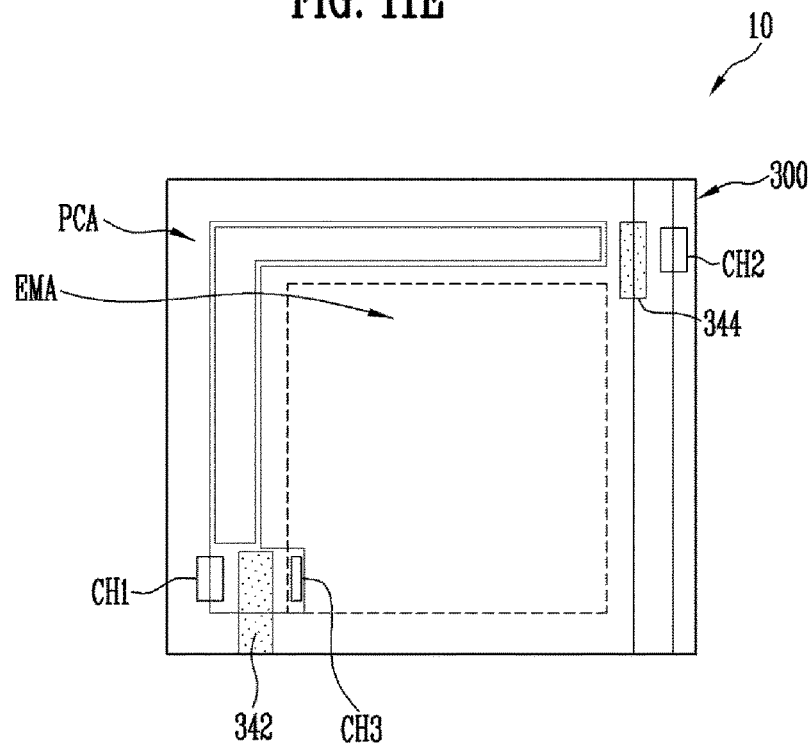

In such an embodiment, as shown in FIG. 11E, a second electrode 342 and a fourth electrode 344 are provided or formed on the surface of the base substrate 300, on which the spacer 330 is provided.

Figure 11F:
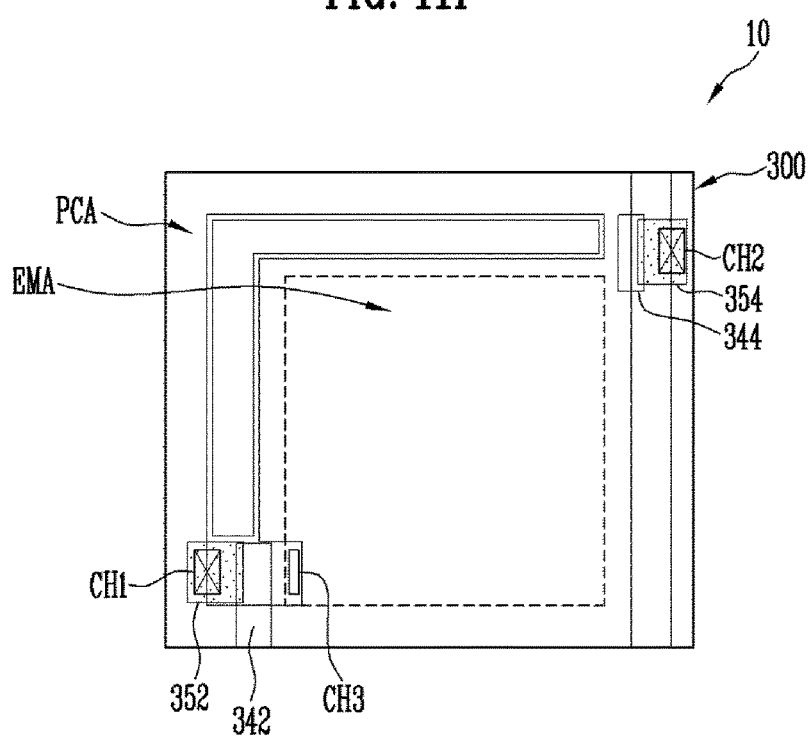
Figure 11G:
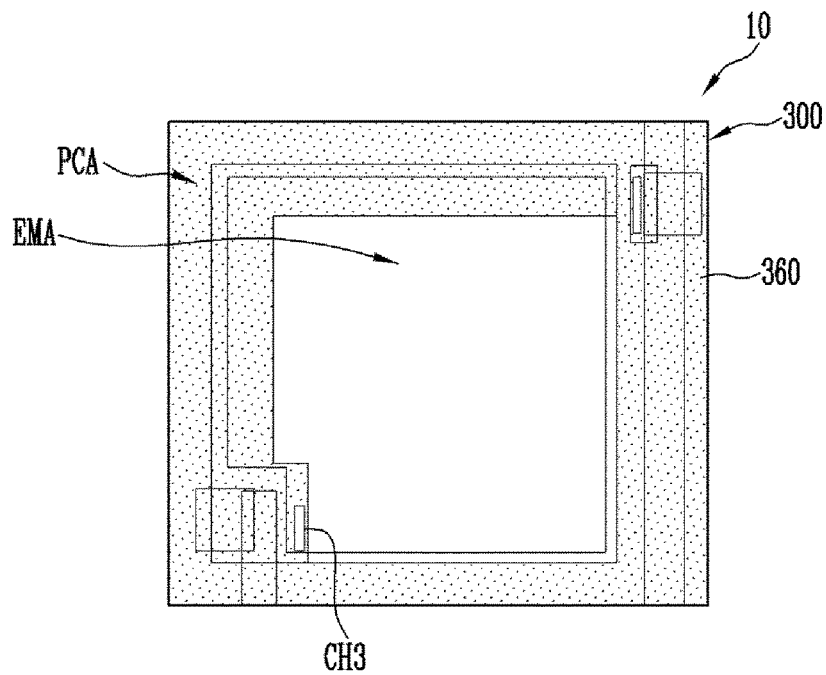

In such an embodiment, as shown in FIGS. 11F and 11G, first and second active layers 352 and 354 and a first insulating layer 360 that covers a pixel circuit area PCA including the first and second active layers 352 and 354 are provided or formed on the surface of the base substrate 300, on which the second electrode 342 and the fourth electrode 344 are provided.

Figure 11H:
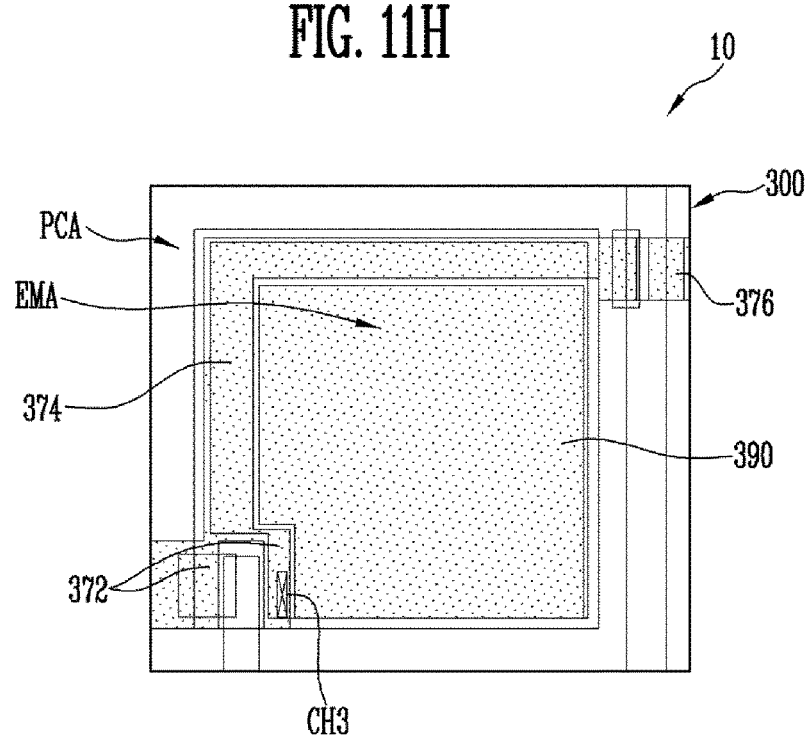

In such an embodiment, a third conductive layer (e.g., a third metal layer) is provided or formed on one region of the base substrate 300, in which the first insulating layer 360 is provided, and a first gate electrode 372, a second storage electrode 374 and a second gate electrode 376 are formed as shown in FIG. 11H by patterning the third conductive layer. In such an embodiment, a pixel electrode 390 may be formed on the light emitting area EMA by patterning the third conductive layer.

Figure 11I:
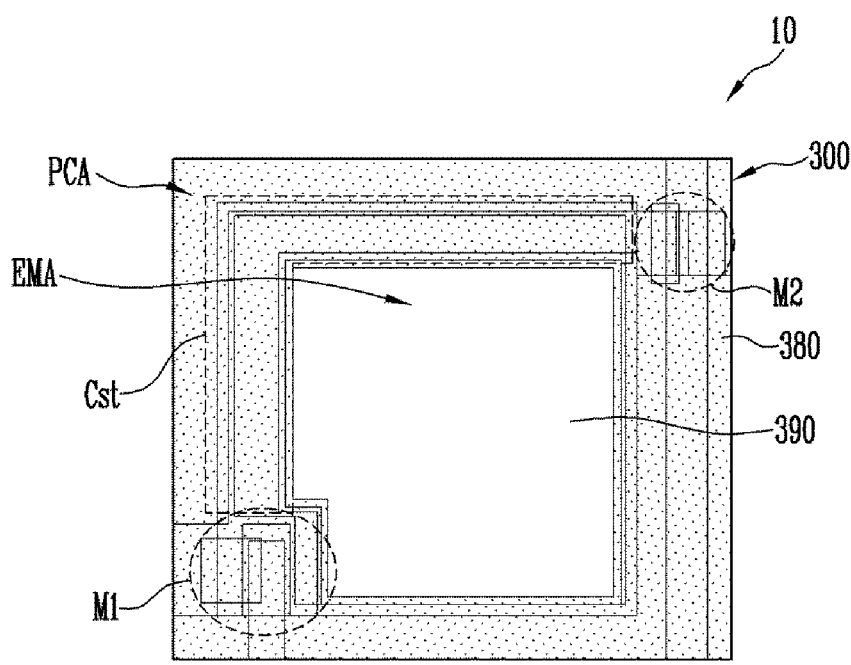

In such an embodiment, as shown in FIG. 11I, a pixel defining layer 380 is provided or formed on at least the pixel circuit area PCA. In such an embodiment, the pixel defining layer 380 is opened in a light emitting area EMA to expose at least one region of the pixel electrode 390. Subsequently, a light emitting layer, a counter electrode and the like, which are not shown, are provided or formed on the pixel electrode 390, thereby constituting a pixel.

In such an embodiment, the pixel electrode 390 may be simultaneously formed with the first gate electrode 372, using a same conductive material as the first gate electrode 372, e.g., the third metal layer. Accordingly, a fabricating process of the display device may be simplified, and the thickness of the display device may be decreased. In addition, the pixel circuit area PCA and the light emitting area EMA are separated from each other, so that the light emitting direction of the display device may be variously modified.

In embodiments of the thin film transistor array substrate and the fabricating method thereof according to the disclosure, a space of the pixel area is efficiently utilized in a high-resolution display device, etc. In such embodiments, the channel length of a transistor provided in each pixel may be sufficiently secured, and characteristics of the transistor may be effectively prevented from being considerably changed due to deformation such as bending. Accordingly, embodiments of the disclosure may be widely applied to various types of display devices including a high-resolution display device and/or a flexible display device.

Exemplary embodiments have been disclosed herein, and although specific terms are employed, they are used and are to be interpreted in a generic and descriptive sense only and not for purpose of limitation. In some instances, as would be apparent to one of ordinary skill in the art as of the filing of the application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the disclosure as set forth in the following claims.

What is claimed is:

1. A thin film transistor array substrate comprising:
   a base substrate;
   a first transistor comprising:
   a first electrode on a surface of the base substrate;
   a spacer on the first electrode;
   a second electrode on the spacer;
   a first active layer contacting the first electrode, the spacer and the second electrode; and
   a first gate electrode opposite to the first active layer with a first insulating layer interposed therebetween;
   a storage capacitor comprising:
   a first storage electrode integrally connected to the first electrode or the second electrode; and
   a second storage electrode opposite to the first storage electrode with the first insulating layer interposed therebetween, wherein the second storage electrode is integrally connected to the first gate electrode; and
   a second transistor electrically connected to the storage capacitor, wherein the second transistor comprises a second active layer extending in a direction intersecting the base substrate,
   wherein at least one layer defining at least one of the first active layer and the second active layer primarily extends in a direction obliquely intersecting a major surface plane defining the base substrate.

2. The thin film transistor array substrate of claim 1, wherein the second transistor further comprises:
   a second gate electrode disposed on the surface of the base substrate, wherein the second gate electrode is opposite to the second active layer with the spacer interposed therebetween;
   a third electrode connected to an end of the second active layer; and
   a fourth electrode connected to an opposing end of the second active layer, with respect to the end of the second active layer.

3. The thin film transistor array substrate of claim 2, wherein a region of the third electrode and a region of the second gate electrode are disposed in a same layer on the surface of the base substrate and spaced apart from each other.

4. The thin film transistor array substrate of claim 2, wherein the fourth electrode and the second storage electrode are integrally connected to each other.

5. The thin film transistor array substrate of claim 2, wherein a region of the spacer between the first electrode and the second electrode is integrally connected to a region of the spacer between the second gate electrode and the second active layer via a region of the spacer between the base substrate and the first storage electrode.

6. The thin film transistor array substrate of claim 5, wherein
   the region of the spacer between the first electrode and the second electrode has a first height, and
   the region of the spacer between the second gate electrode and the second active layer has a second height lower than the first height.

7. The thin film transistor array substrate of claim 2, wherein an upper surface of the spacer has a step corresponding to a height of the first electrode.

8. The thin film transistor array substrate of claim 2, wherein an opening is defined in a region of the spacer corresponding to a region of the storage capacitor.

9. The thin film transistor array substrate of claim 2, wherein the first electrode and the second gate electrode are defined by a same metal layer.

10. The thin film transistor array substrate of claim 2, wherein the second electrode and the first storage electrode are defined by a same metal layer.

11. The thin film transistor array substrate of claim 2, wherein the first gate electrode, the second storage electrode, the third electrode and the fourth electrode are defined by a same metal layer.

12. The thin film transistor array substrate of claim 1, wherein the first active layer and the second active layer comprise an oxide semiconductor.

13. The thin film transistor array substrate of claim 1, wherein at least one of the first active layer and the second active layer comprises polycrystalline silicon.

14. The thin film transistor array substrate of claim 1, wherein the first gate electrode is a dual gate electrode.

15. The thin film transistor array substrate of claim 1, further comprising:
   a second insulating layer covering the first transistor, the second transistor and the storage capacitor; and
   a pixel electrode disposed on the second insulating layer to overlap with at least one of the first transistor, the second transistor and the storage capacitor,
   wherein the pixel electrode is electrically connected to the second electrode.

16. The thin film transistor array substrate of claim 1, wherein the spacer comprises at least one of an organic layer and an inorganic layer.

17. The thin film transistor array substrate of claim 1, wherein
   an individual pixel area is defined on the surface of the base substrate, and
   the individual pixel area comprises a light emitting area and a pixel circuit area disposed at a circumference of the light emitting area.

18. The thin film transistor array substrate of claim 17, further comprising:
   a pixel electrode disposed on the surface of the base substrate in the light emitting area,
   wherein the pixel electrode comprises a same material as one of the first electrode, the second electrode and the first gate electrode.

19. The thin film transistor array substrate of claim 18, wherein the pixel electrode is integrally connected to the first electrode or the second electrode.

* * * * *